United States Patent
Shu et al.

(10) Patent No.: US 10,170,488 B1
(45) Date of Patent: Jan. 1, 2019

(54) NON-VOLATILE MEMORY OF SEMICONDUCTOR DEVICE AND METHOD FOR MANUFACTURING THE SAME

(71) Applicant: TAIWAN SEMICONDUCTOR MANUFACTURING CO., LTD., Hsinchu (TW)

(72) Inventors: Cheng-Bo Shu, Tainan (TW); Tsung-Yu Yang, Tainan (TW); Chung-Jen Huang, Tainan (TW)

(73) Assignee: TAIWAN SEMICONDUCTOR MANFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/865,454

(22) Filed: Jan. 9, 2018

Related U.S. Application Data

(60) Provisional application No. 62/590,398, filed on Nov. 24, 2017.

(51) Int. Cl.
| | |
|---|---|
| H01L 21/00 | (2006.01) |
| H01L 27/11517 | (2017.01) |
| H01L 29/78 | (2006.01) |
| H01L 29/423 | (2006.01) |
| H01L 21/28 | (2006.01) |
| H01L 21/762 | (2006.01) |

(52) U.S. Cl.
CPC .. *H01L 27/11517* (2013.01); *H01L 21/28141* (2013.01); *H01L 21/762* (2013.01); *H01L 29/42328* (2013.01); *H01L 29/7833* (2013.01)

(58) Field of Classification Search
CPC ......... H01L 27/11521; H01L 27/11517; H01L 29/66825
See application file for complete search history.

(56) References Cited

U.S. PATENT DOCUMENTS

| | | | | |
|---|---|---|---|---|
| 8,325,521 | B2* | 12/2012 | Hsieh | G11C 16/08 365/185.05 |
| 8,384,147 | B2* | 2/2013 | Do | H01L 21/28273 257/315 |
| 9,252,150 | B1* | 2/2016 | Shih | H01L 27/11521 |
| 9,349,741 | B2* | 5/2016 | Liu | H01L 27/11524 |
| 9,431,257 | B2* | 8/2016 | Liu | H01L 27/1157 |
| 9,646,978 | B2* | 5/2017 | Wu | H01L 29/7831 |
| 9,711,519 | B2* | 7/2017 | Liu | H01L 27/1157 |

(Continued)

*Primary Examiner* — Nicholas J Tobergte
(74) *Attorney, Agent, or Firm* — McClure, Qualey & Rodack, LLP

(57) ABSTRACT

A semiconductor device includes a substrate and a floating gate memory cell. The floating gate memory cell includes an erase gate structure disposed on the substrate, a first floating gate structure, a second floating gate structure, a first word line, a common source, a second word line, a first spacer and a second spacer. The first floating gate structure and the second floating gate structure are recessed in the substrate at two opposite sides of the erase gate structure. The first word line and the second word line are respectively adjacent to the first floating gate structure and the second floating gate structure. The common source is disposed in the substrate under the erase gate structure. The first spacer and the second spacer are respectively disposed between the first floating gate structure and the first word line and between the second floating gate structure and the second word line.

20 Claims, 35 Drawing Sheets

(56) References Cited

U.S. PATENT DOCUMENTS

| | | | |
|---|---|---|---|
| 9,966,380 B1 * | 5/2018 | Bo | H01L 27/11521 |
| 2008/0258200 A1 * | 10/2008 | Wang | H01L 27/115 257/316 |
| 2011/0165746 A1 * | 7/2011 | Liu | H01L 21/28273 438/264 |
| 2012/0273864 A1 * | 11/2012 | Do | H01L 21/28273 257/315 |
| 2014/0151782 A1 * | 6/2014 | Tsair | H01L 29/7881 257/320 |
| 2015/0263123 A1 * | 9/2015 | Cheng | H01L 29/66825 257/319 |

* cited by examiner

NON-VOLATILE MEMORY OF SEMICONDUCTOR DEVICE AND METHOD FOR MANUFACTURING THE SAME

RELATED APPLICATIONS

This application claims priority to U.S. Provisional Application Ser. No. 62/590,398, filed Nov. 24, 2017, which is herein incorporated by reference.

BACKGROUND

The semiconductor integrated circuit (IC) industry has experienced exponential growth over the last few decades. In the course of IC evolution, functional density (i.e., the number of interconnected devices per chip area) has generally increased while geometry size (i.e., the smallest component (or line) that can be created using a fabrication process) has decreased.

Super-flash technology has enabled designers to create cost effective and high performance programmable SOC (system on chip) solutions through the use of split-gate flash memory cells. The aggressive scaling of the third generation embedded super-flash (ESF3) memory enables designing flash memories with very high memory array density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
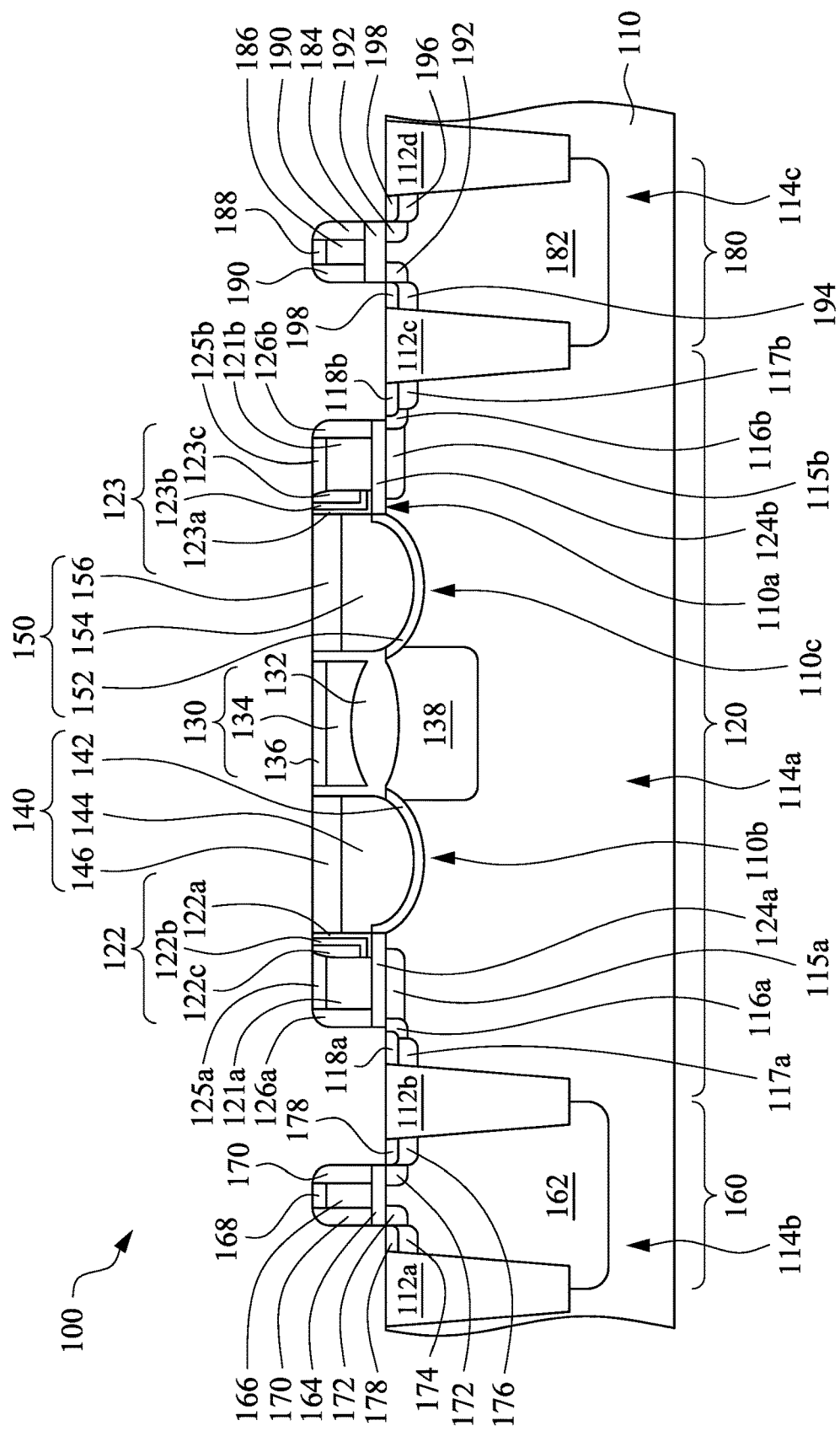
FIG. 1 is a schematic cross-sectional view of a semiconductor device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a typical process for manufacturing a 1.5 T ESF3 memory, the 1.5 T ESF3 memory is formed with a floating gate for charge trapping. However, a gate structure including the floating gate has a higher stack topology, such that it is more complicated to integrate the process of the 1.5 T ESF3 memory and a logic process due to topology problems.

Embodiments of the present disclosure are directed to providing a semiconductor device and a method for manufacturing the semiconductor device, in which each floating gate of a floating gate memory cell includes a recess channel, and the floating gate memory cell is programmed using a common source coupling source side injection (SSI) programming method, such that control gates are omitted, thereby lowering a structure topology of the floating gate memory cell. Thus, it is much easier to integrate a process of the floating gate memory cell and a logic process. Furthermore, the recess channels of the floating gates enhance a coupling ratio of a common source and increase an effective channel length, thus decreasing a short channel effect.

FIG. 1 is schematic cross-sectional view of a semiconductor device in accordance with various embodiments. In some embodiments, a semiconductor device 100 includes a non-volatile memory. In some examples, the semiconductor device 100 includes a substrate 110, various isolation structures 112a, 112b, 112c and 112d, a floating gate memory cell 120, a first device 160, and a second device 180. The substrate 110 may be a semiconductor substrate. The substrate 110 may be composed of a single-crystalline semiconductor material or a compound semiconductor material. For example, silicon or germanium may be used as a material forming the substrate 110. In certain examples, the substrate 110 may be a silicon on insulator (SOI) substrate. The substrate 110 has a surface 112. The substrate 110 includes at least two recesses 110b and 110c, such that bottoms of the recesses 110b and 110c are lower than the surface 110a of the substrate 110.

The isolation structures 112a, 112b, 112c and 112d are disposed in the substrate 110 to at least define a first region 114a, a second region 114b, and a third region 114c on the substrate 110. The first region 114a is located between the isolation structures 112b and 112c, the second region 114b is located between the isolation structures 112a and 112b, and the third region 114c is located between the isolation structures 112c and 112d. The isolation structures 112a, 112b, 112c and 112d may be shallow trench isolation (STI) structures. For example, the isolation structures 112a, 112b, 112c and 112d may be formed from silicon oxide.

The floating gate memory cell 120 is disposed in the first region 114a of the substrate 110. In some examples, the floating gate memory cell 120 includes an erase gate structure 130, a first floating gate structure 140, a second floating gate structure 150, a first word line 121a, a second word line 121b, a common source 138, a first spacer 122, and a second spacer 123.

The first floating gate structure 140 is disposed in the recess 110b of the substrate 110, such that the first floating gate structure 140 is recessed in the substrate 110. In some examples, the first floating gate structure 140 includes a gate dielectric layer 142, a floating gate 144, and a mask layer 146. The gate dielectric layer 142 covers a surface of the recess 110b. For example, the gate dielectric layer 142 may conformally cover the surface of the recess 110b. The gate dielectric layer 142 may be formed from silicon oxide. The floating gate 144 is disposed on the gate dielectric layer 142 in the recess 110b, such that the gate dielectric layer 142 is disposed between the substrate 110 and the floating gate 144. In some exemplary examples, a bottom of the floating gate 144 is lower than the surface 110a of the substrate 110, such that the floating gate 144 is recessed in the substrate 110. For example, the floating gate 144 may be formed from polysilicon. The mask layer 146 is disposed on the floating gate 144. For example, the mask layer 146 may be formed from silicon oxide.

The second floating gate structure 150 is disposed in the recess 110c of the substrate 110, such that the second floating gate structure 150 is recessed in the substrate 110. In some examples, the second floating gate structure 150 includes a gate dielectric layer 152, a floating gate 154, and a mask layer 156. The gate dielectric layer 152 covers a surface of the recess 110c. For example, the gate dielectric layer 152 may conformally cover the surface of the recess 110c. The gate dielectric layer 152 may be formed from silicon oxide. The floating gate 154 is disposed on the gate dielectric layer 152 in the recess 110c, such that the gate dielectric layer 152 is disposed between the substrate 110 and the floating gate 154. In some exemplary examples, a bottom of the floating gate 154 is lower than the surface 110a of the substrate 110, such that the floating gate 154 is recessed in the substrate 110. For example, the floating gate 154 may be formed from polysilicon. The mask layer 156 is disposed on the floating gate 154. For example, the mask layer 156 may be formed from silicon oxide.

The common source 138 is disposed in the substrate 110, and is located between the first floating gate structure 140 and the second floating gate structure 150. The common source 138 includes dopants, such as boron and phosphorous.

The erase gate structure 130 is disposed on the surface 110a of the substrate 110. The erase gate structure 130 is located between the first floating gate structure 140 and the second floating gate structure 150, such that the first floating gate structure 140 and the second floating gate structure 150 are located at two opposite sides of the erase gate structure 130. The erase gate structure 130 includes an erase tunnel dielectric layer 132, an erase gate 134, and a silicide layer 136. The erase gate 134 is disposed over the common source 138. For example, the erase gate 134 may be formed from polysilicon. The silicide layer 136 is disposed on the erase gate 134. The erase gate 134 and the silicide layer 136 are located between the gates 144 and 154. The erase tunnel dielectric layer 132 is disposed on the common source 138, in which the erase tunnel dielectric layer 132 is located between the common source 138 and the erase gate 134, between the first floating gate structure 140 and the erase gate 134, and between the second floating gate structure 150 and the erase gate 134. Thus, the erase gate 134 and the silicide layer 136 are separated from the common source 138 and the gates 144 and 154 by the erase tunnel dielectric layer 132. For example, the erase tunnel dielectric layer 132 may be form from silicon oxide.

In some examples, the floating gate memory cell 120 may further include dielectric layers 124a and 124b. The dielectric layer 124a is disposed on the surface 110a of the substrate 110 and is adjacent to the gate dielectric layer 142. The dielectric layer 124b is disposed on the surface 110a of the substrate 110 and is adjacent to the gate dielectric layer 152. In some exemplary examples, the dielectric layers 124a and 124b are formed from silicon oxide.

Referring to FIG. 1 again, the first spacer 122 is disposed on a portion of the dielectric layer 124a and abuts a sidewall of the first floating gate structure 140. In some examples, the first spacer 122 includes dielectric layers 122a, 122b, and 122c stacked on the dielectric layer 124a and the sidewall of the first floating gate structure 140 in sequence. The dielectric layer 122a may be formed from silicon oxide, the dielectric layer 122b may be formed from silicon nitride, and the dielectric layer 122c may be formed from silicon oxide, such that the first spacer 122 may include an oxide-nitride-oxide (ONO) structure.

The second spacer 123 is disposed on a portion of the dielectric layer 124b and abuts a sidewall of the second floating gate structure 150. In some examples, the second spacer 123 includes dielectric layers 123a, 123b, and 123c stacked on the dielectric layer 124b and the sidewall of the second floating gate structure 150 in sequence. Similarly the dielectric layer 123a may be formed from silicon oxide, the dielectric layer 123b may be formed from silicon nitride, and the dielectric layer 123c may be formed from silicon oxide, such that the second spacer 123 may include an oxide-nitride-oxide structure.

The first word line 121a is disposed on another portion of the dielectric layer 124a over the surface 110a of the substrate 110 and is adjacent to the first spacer 122, such that the first spacer 122 is located between the first floating gate structure 140 and the first word line 121a to separate the gate 144 from the first word line 121a. The first word line 121a and the erase gate structure 130 are located at opposite sides of the first floating gate structure 140. For example, the first word line 121a may be formed from polysilicon. In some exemplary examples, the floating gate memory cell 120 further includes a silicide layer 125a and a spacer 126a. The silicide layer 125a is disposed on the first word line 121a. The first spacer 122 separates the gate 144 from the silicide layer 125a. The spacer 126a is disposed on the other portion of the dielectric layer 124a adjacent to the first word line 121a and the silicide layer 125a. For example, the spacer 126a may be formed from silicon nitride or silicon oxynitride.

The second word line 121b is disposed on another portion of the dielectric layer 124b over the surface 110a of the substrate 110 and is adjacent to the second spacer 123, such that the second spacer 123 is located between the second floating gate structure 150 and the second word line 121b to separate the gate 154 from the second word line 121b. The second word line 121b and the erase gate structure 130 are located at opposite sides of the second floating gate structure 150. For example, the second word line 121b may be formed from polysilicon. In some exemplary examples, the floating gate memory cell 120 further includes a silicide layer 125b and a spacer 126b. The silicide layer 125b is disposed on the second word line 121b. The second spacer 123 separates the gate 154 from the silicide layer 125b. The spacer 126b is disposed the other portion of the dielectric layer 124b adjacent to the second word line 121b and the silicide layer 125b. For example, the spacer 126b may be formed from silicon nitride or silicon oxynitride.

Referring to FIG. 1 again, in some examples, the floating gate memory cell 120 may include implantation regions 115a, 115b, 117a, and 117b, lightly doped drains (LDD) 116a and 116b, and silicide layers 118a and 118b. The implantation regions 115a, 115b, 117a, and 117b, and the lightly doped drains 116a, 116b are disposed in the substrate 110 adjacent to the surface 110a. The implantation regions 115a and 115b are respectively under the dielectric layers 124a and 124b. The lightly doped drains 116a and 116b are respectively disposed in the implantation regions 115a and 115b. The implantation regions 117a and 117b are respectively disposed in the lightly doped drains 116a and 116b. The silicide layer 118a is disposed on the lightly doped drain 116a and the implantation region 117a. The silicide layer 118b is disposed on the lightly doped drain 116b and the implantation region 117b.

The first device 160 is disposed in the second region 114b of the substrate 110. For example, the first device 160 may be a low voltage device. In some examples, the first device 160 includes a well 162, a gate dielectric layer 164, a gate 166, a silicide layer 168, two spacers 170, two lightly-doped drains 172, a source 174, and a drain 176. The well 162 is disposed in the substrate 110. The well 162 includes dopants, such as boron and phosphorous. The gate dielectric layer 164 is disposed on the well 162. The gate dielectric layer 164 may be formed from silicon oxide. The gate 166 is disposed on a portion of the gate dielectric layer 164. The gate 166 may be formed from polysilicon. The silicide layer 168 is disposed on the gate 166. The spacers 170 are disposed on the other portions of the gate dielectric layer 164, and the spacers 170 are disposed at opposite sides of the gate 166 and the silicide layer 168, such that the spacers 170 sandwich the gate 166 and the silicide layer 168.

The lightly-doped drains 172 are disposed in the well 162 adjacent to the opposite sides of the gate 168. The source 174 and the drain 176 are respectively disposed in the lightly-doped drains 172 adjacent to the opposite sides of the gate 168. In some exemplary examples, the first device 160 further includes two silicide layers 178, in which the silicide layers 178 are respectively disposed on the lightly doped drains 172, and are respectively located on the source 174 and the drain 176.

The second device 180 is disposed in the third region 114c of the substrate 110. For example, the second device 180 may be a high voltage device. In some examples, the second device 180 includes a well 182, a gate dielectric layer 184, a gate 186, a silicide layer 188, two spacers 190, two lightly-doped drains 192, a source 194, and a drain 196. The well 182 is disposed in the substrate 110. The well 182 includes dopants, such as boron and phosphorous. The gate dielectric layer 184 is disposed on the well 182. In some exemplary examples, the gate dielectric layer 164 of the first device 160 is thinner than the gate dielectric layer 184 of the second device 180. The gate dielectric layer 184 may be formed from silicon oxide. The gate 186 is disposed on a portion of the gate dielectric layer 184. The gate 186 may be formed from polysilicon. The silicide layer 188 is disposed on the gate 186. The spacers 190 are disposed on the other portions of the gate dielectric layer 184, and the spacers 190 are disposed at opposite sides of the gate 186 and the silicide layer 188, such that the spacers 190 sandwich the gate 186 and the silicide layer 188.

The lightly-doped drains 192 are disposed in the well 182 adjacent to the opposite sides of the gate 188. The source 194 and the drain 196 are respectively disposed in the lightly-doped drains 192 adjacent to the opposite sides of the gate 188. In some exemplary examples, the first device 180 further includes two silicide layers 198, in which the silicide layers 198 are respectively disposed on the lightly doped drains 192, and are respectively located on the source 194 and the drain 196.

In the floating gate memory cell 120 of the semiconductor device 100, the gate 144 of the first floating gate structure 140 and the gate 154 of the second floating gate structure 150 are recessed in the substrate, such that each of the first floating gate structure 140 and the second floating gate structure 150 has a recess channel. The recess channels of the first floating gate structure 140 and the second floating gate structure 150 enhance a coupling ratio of the common source 138 and increase an effective channel length, thus decreasing a short channel effect. The floating gate memory cell 120 is programmed using a common source coupling source side injection programming method, such that control gates are omitted, thereby lowering a structure topology of the floating gate memory cell 120. Thus, it is much easier to integrate a process of the floating gate memory cell 120 and a logic process.

Figure 2A:
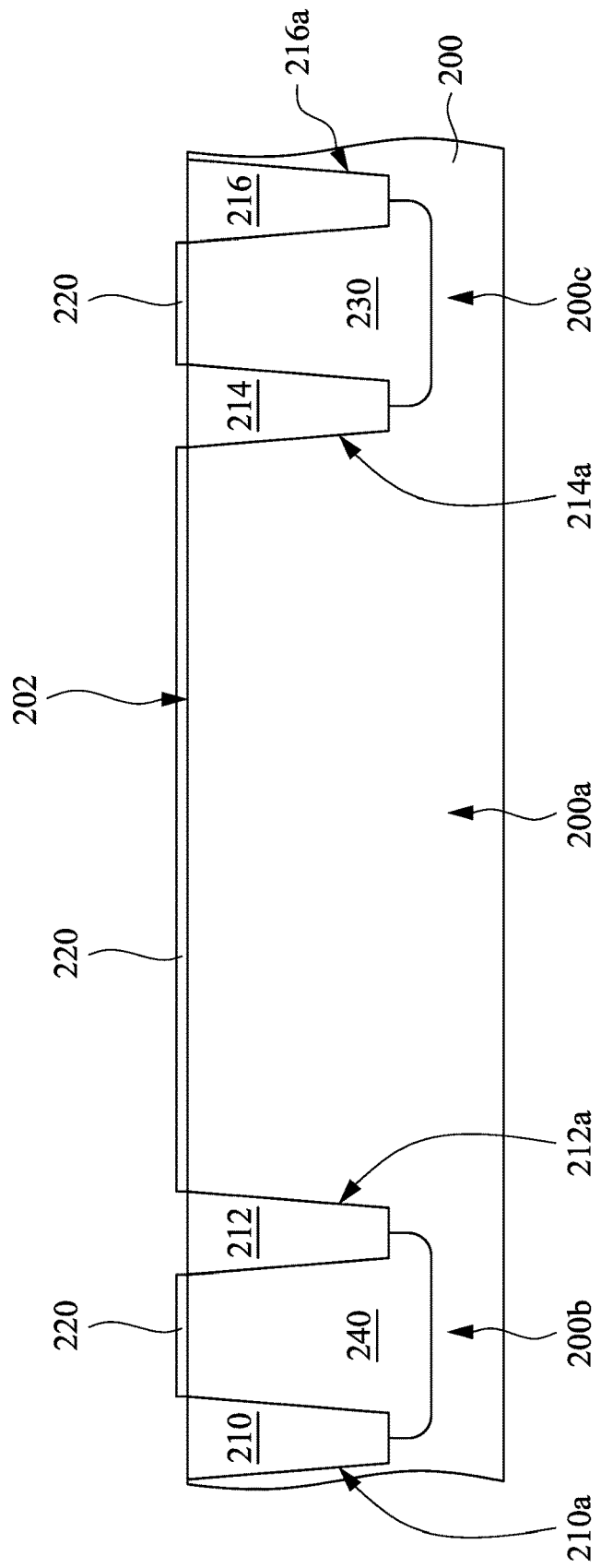
FIG. 2A through FIG. 3G are schematic cross-sectional views of intermediate stages showing a method for manufacturing a semiconductor device in accordance with various embodiments.

FIG. 2A through FIG. 3G are schematic cross-sectional views of intermediate stages showing a method for manufacturing a semiconductor device in accordance with various embodiments. As shown in FIG. 2A, a substrate 200 is provided. The substrate 200 may be a semiconductor substrate. For example, the substrate 200 may be composed of a single-crystalline semiconductor material or a compound semiconductor material. In some exemplary examples, silicon or germanium id used as a material forming the substrate 200. In certain examples, the substrate 200 may be a silicon on insulator substrate.

Referring to FIG. 2A again, various isolation structures 210, 212, 214, and 216 are formed in the substrate 200. In some examples, in the formation of the isolation structures 210, 212, 214, and 216, a pad oxide layer 220 is formed to blanketly cover a surface 202 of the substrate 200 by, for example, a deposition method or a thermal oxidization method. The pad oxide layer 220 may be formed from silicon oxide. A hard mask (not shown) is formed to cover the pad oxide layer 220 by, for example, a deposition method. The hard mask may be formed from silicon nitride. Then, the hard mask and the pad oxide layer 220 are patterned by, for example, a photolithography process and an etch process. Patterning the hard mask and the pad oxide layer 220 is performed to remove portions of the hard mask and portions of the pad oxide layer 220 to expose portions of the substrate 200. The portions of the substrate 200, which are not covered by the patterned hard mask and the patterned pad oxide layer 220, are removed by an etch process, so as to form various trenches 210a, 212a, 214a, and 216a in the substrate 200. An isolation material is formed to fill the trenches 210a, 212a, 214a, and 216a and to cover the hard mask layer. In some exemplary examples, the isolation material is formed by using a high density plasma chemical vapor deposition (HDP CVD) method. A polish process may be performed to polish the isolation material, so as to expose the hard mask. For example, the polish process may be a chemical mechanical polish (CMP) process. Then, the hard mask is removed to form the isolation structures 210, 212, 214, and 216 in the substrate 200. The isolation structures 210, 212, 214, and 216 may be shallow trench isolation structures.

As shown in FIG. 2A, the isolation structures 210, 212, 214, and 216 formed in the substrate 200 at least define a first region 200a, a second region 200b, and a third region 200c on the substrate 200, in which the first region 200a is located between the isolation structures 212 and 214, the second region 200b is located between the isolation structures 210 and 212, and the third region 200c is located between the isolation structures 214 and 216. After the isolation structures 210, 212, 214, and 216 are completed, the remaining pad oxide layer 220 is located on the first region 200a, the second region 200b, and the third region 200c on the surface 202 of the substrate 200.

In some examples, as shown in FIG. 2A, after the isolation structures 210, 212, 214, and 216 are completed, a high voltage well 230 is formed in the third region 200c by using a photolithography method and an implantation method. The high voltage well 230 includes an n-type well and a p-type well. A logic well 240 is formed in the second region 200b by using a photolithography method and an implantation method.

Figure 2B:
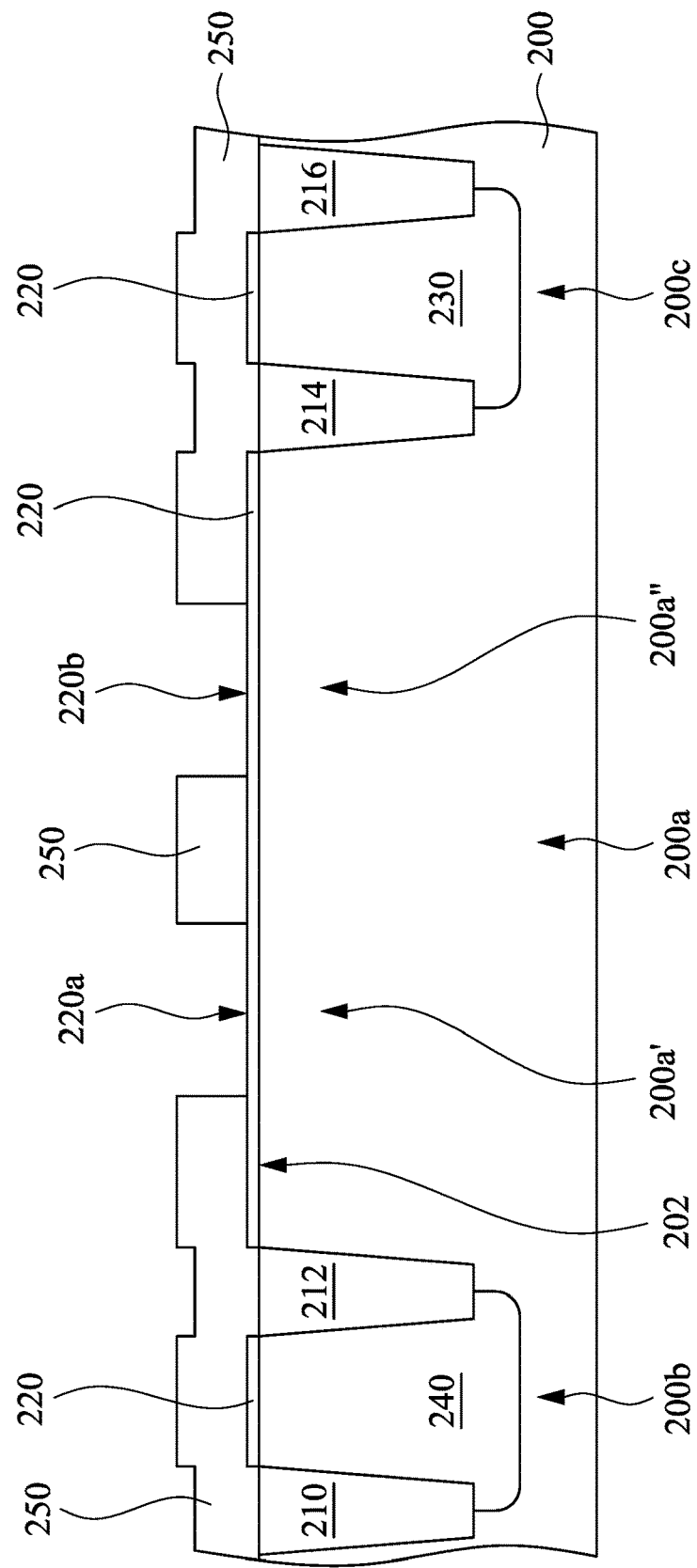

As shown in FIG. 2B, a hard mask layer 250 is formed on the first region 200a, second region 200b, and the third region 200c, in which the hard mask layer 250 is formed to expose two portions 220a and 220b of the pad oxide layer 220 on two portions 200a' and 200a" of the first region 200a in the substrate 200. In some exemplary examples, in forming the hard mask layer 250, a hard mask material layer is formed to cover the pad oxide layer 220, and the isolation structures 210, 212, 214, and 216, and the hard mask material layer is patterned to remove portions of the hard mask material layer, so as to form the hard mask layer 250 exposing the portions 220a and 220b of the pad oxide layer 220. The hard mask material layer may be formed by a deposition process, such as a chemical vapor deposition (CVD) process. The hard mask material layer may be patterned by using a photolithography method and an etch method, such as a dry etch method. For example, the hard mask layer 250 may be formed from silicon nitride.

Figure 2C:
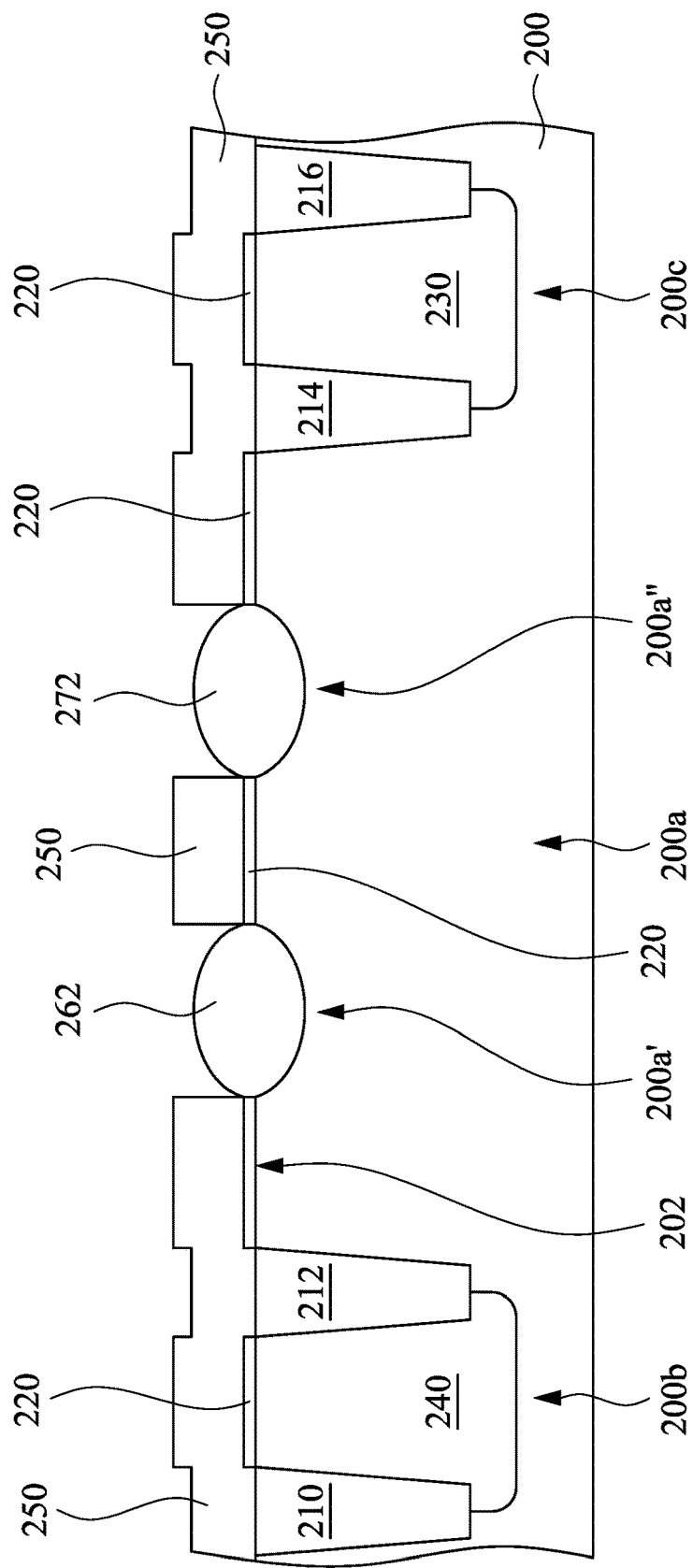
Figure 2D:
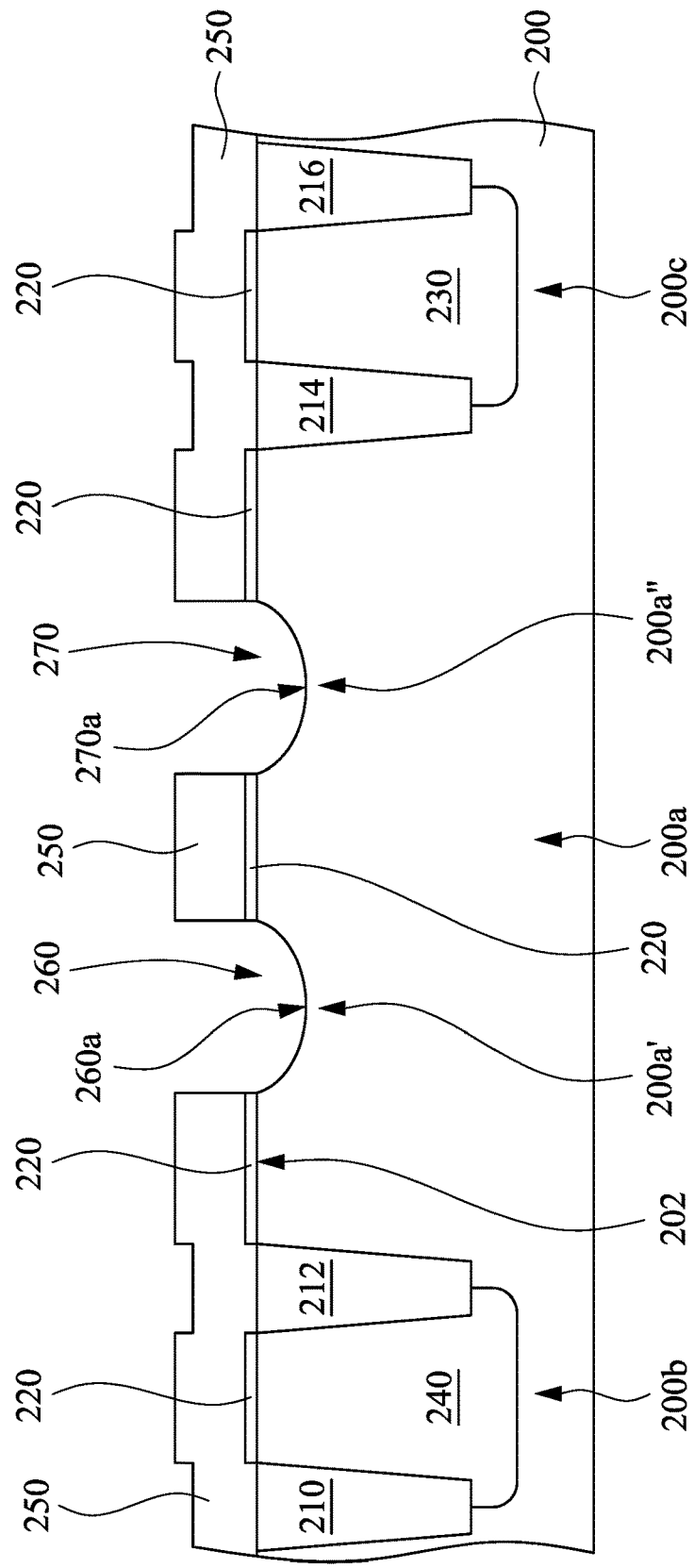

As shown in FIG. 2D, two recesses 260 and 270 are formed in the portions 200a' and 200a" of the first region 200a in the substrate 200, such that a bottom 260a of the recess 260 and a bottom 270a of the recess 270 are lower than the surface 202 of the substrate 200. The recesses 260 and 270 may be formed by using an oxidation method or an etch method. In some exemplary examples, referring to FIG. 2C, the recesses 260 and 270 are formed by using an oxidization method, and in forming the recesses 260 and 270, an oxidization process is performed to oxidize the substrate 200 in the portions 200a' and 200a", so as to form oxide structures 262 and 272 respectively in the portions 200a' and 200a". Then, as shown in FIG. 2D, the oxide structures 262 and 272 are removed to respectively form the recesses 260 and 270 in the portions 200a' and 200a" of the first region 200a. For example, the oxide structures 262 and 272 may be removed by using an etch process, such a dry etch process or a wet etch process.

Figure 2E:
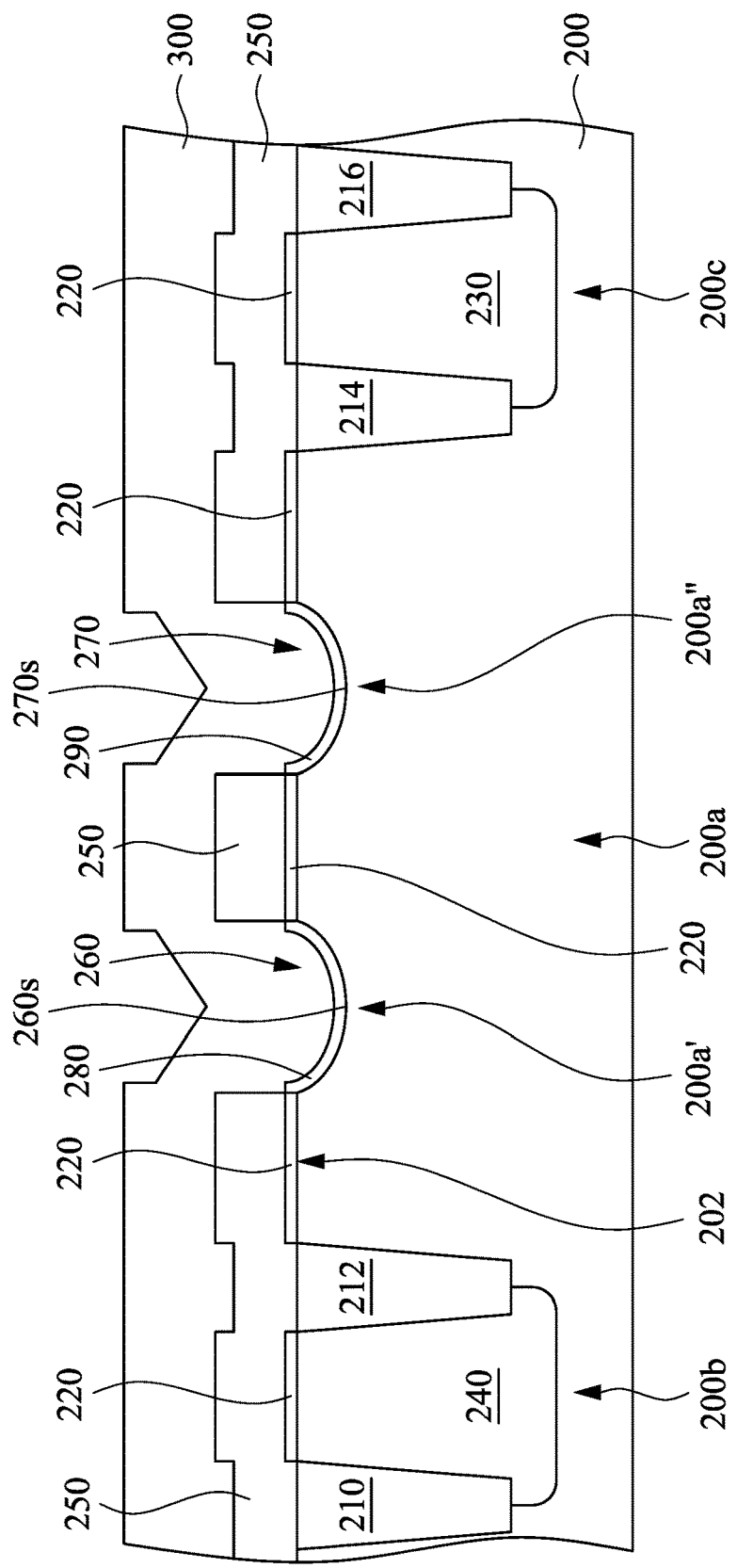

As shown in FIG. 2E, two gate dielectric layers 280 and 290 are respectively formed to cover a surface 260s of the recess 260 and a surface 270s of the recess 270. For example, the gate dielectric layers 280 and 290 may be formed by using an oxidization method or a deposition method, such as a chemical vapor deposition method. The gate dielectric layers 280 and 290 may be formed from silicon oxide. In some exemplary examples, the gate dielectric layers 280 and 290 conformally cover the surface 260s of the recess 260 and the surface 270s of the recess 270 respectively.

Referring to FIG. 2E again, a gate material layer 300 is formed on the hard mask layer 250 and the gate dielectric layers 280 and 290. The recesses 260 and 270 are filled with the gate material layer 300. The gate material layer 300 may be formed by using a deposition method, such as a chemical vapor deposition method, a plasma-enhanced chemical vapor deposition (PECVD) method, or a physical vapor deposition (PVD) method. In some exemplary examples, the gate material layer 300 is formed from polysilicon.

Figure 2F:
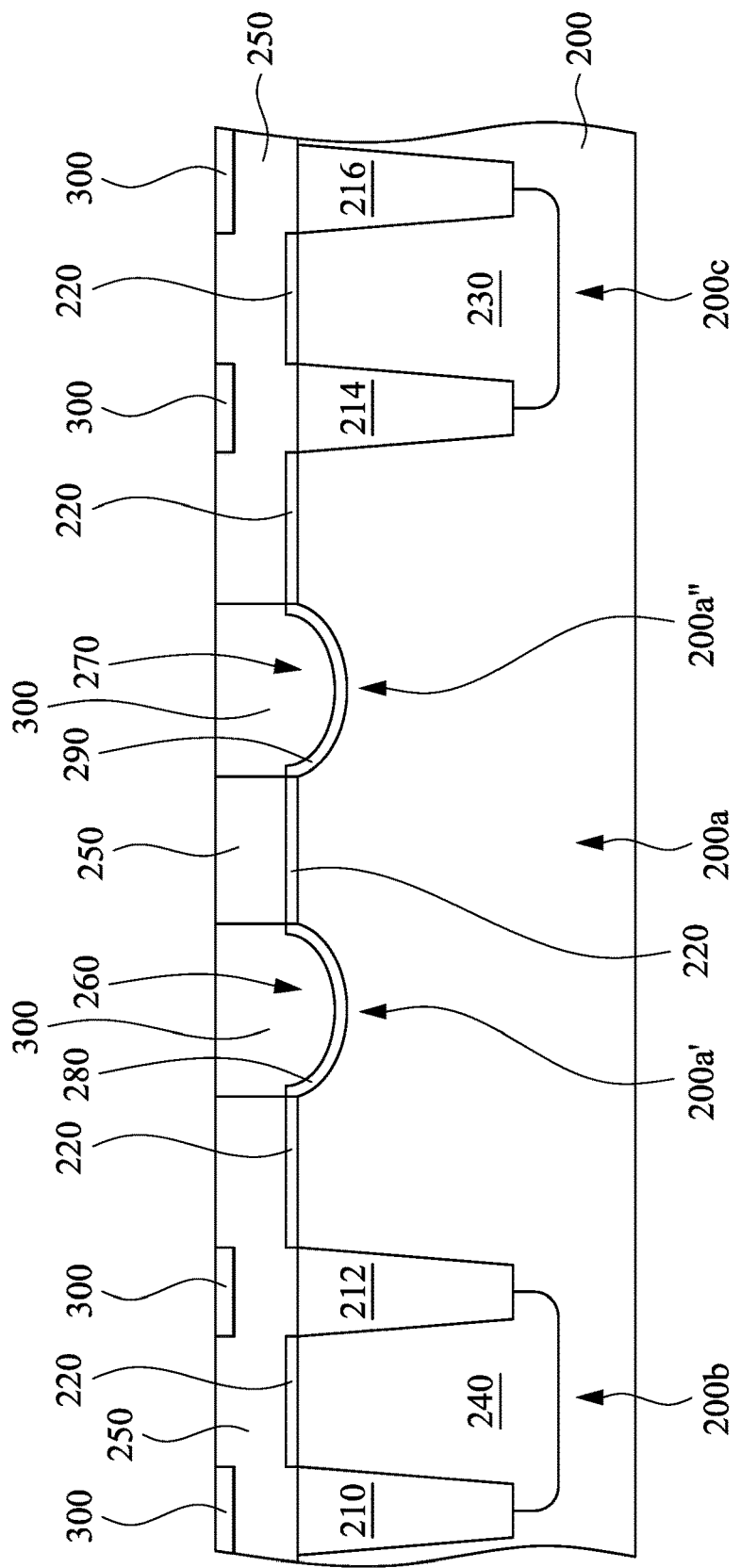

As shown in FIG. 2F, a planarization process may be optionally performed on the gate material layer 300 by, for example, a chemical mechanical polishing technique. The planarization process is performed to remove portions of the gate material layer 300. The planarization process may stop on a top of the hard mask layer 250.

Figure 2G:
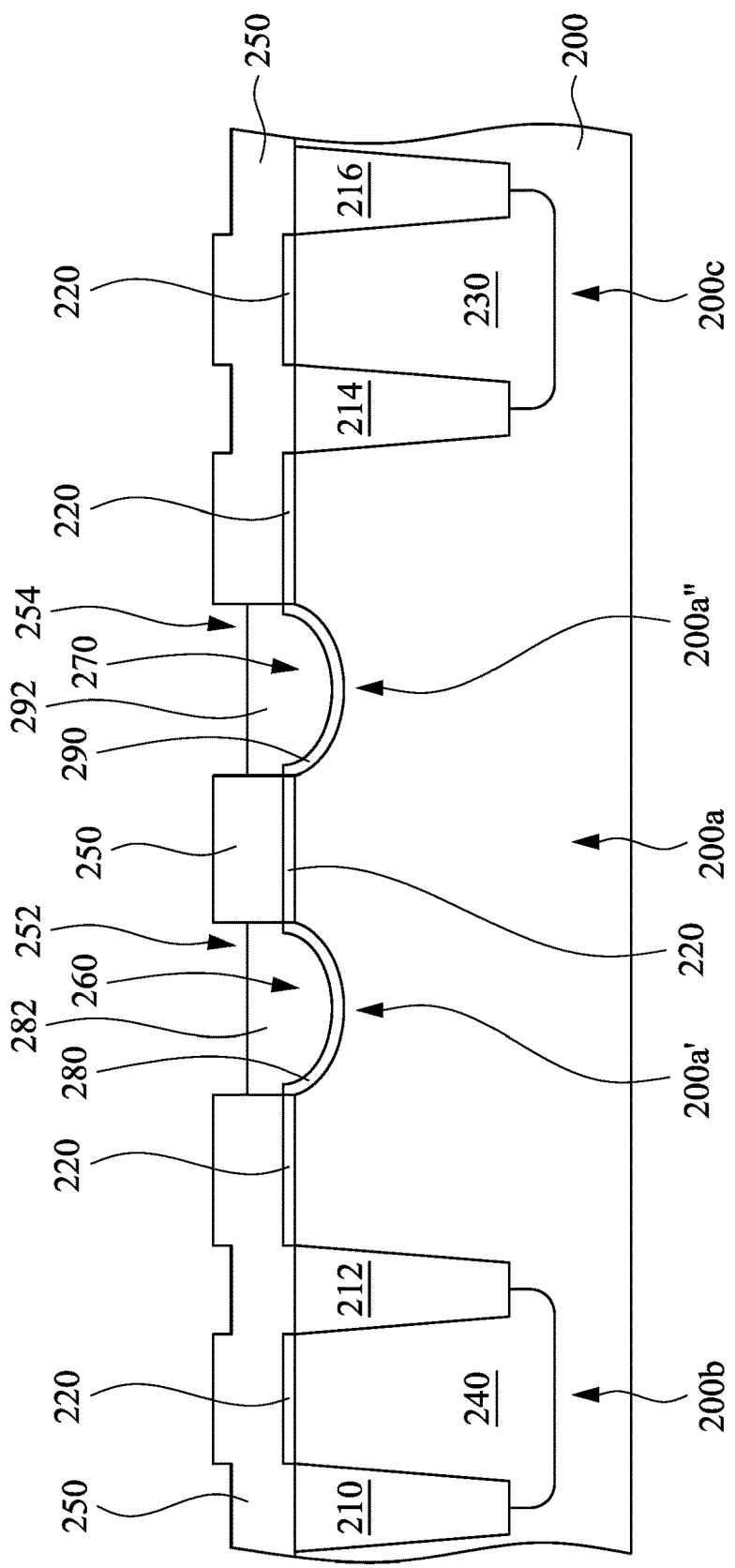

In some examples, as shown in FIG. 2G, an etch back process is performed on the remaining gate material layer 300 to remove portions of the gate material layer 300 which remain on the hard mask layer 250, and portions of the gate material layer 300 disposed on the recesses 260 and 270. The portions of the gate material layer 300 disposed on the recesses 260 and 270 are removed to respectively form floating gates 282 and 292 on the gate dielectric layers 280 and 290. For example, the etch back process may be performed by using a dry etch technique or a wet etching technique. After the etch back process is completed, tops of the floating gates 282 and 292 are lower than the top of the hard mask layer 250, such that trenches 252 and 254 are respectively formed above the floating gates 282 and 292 in the hard mask layer 250.

Figure 2H:
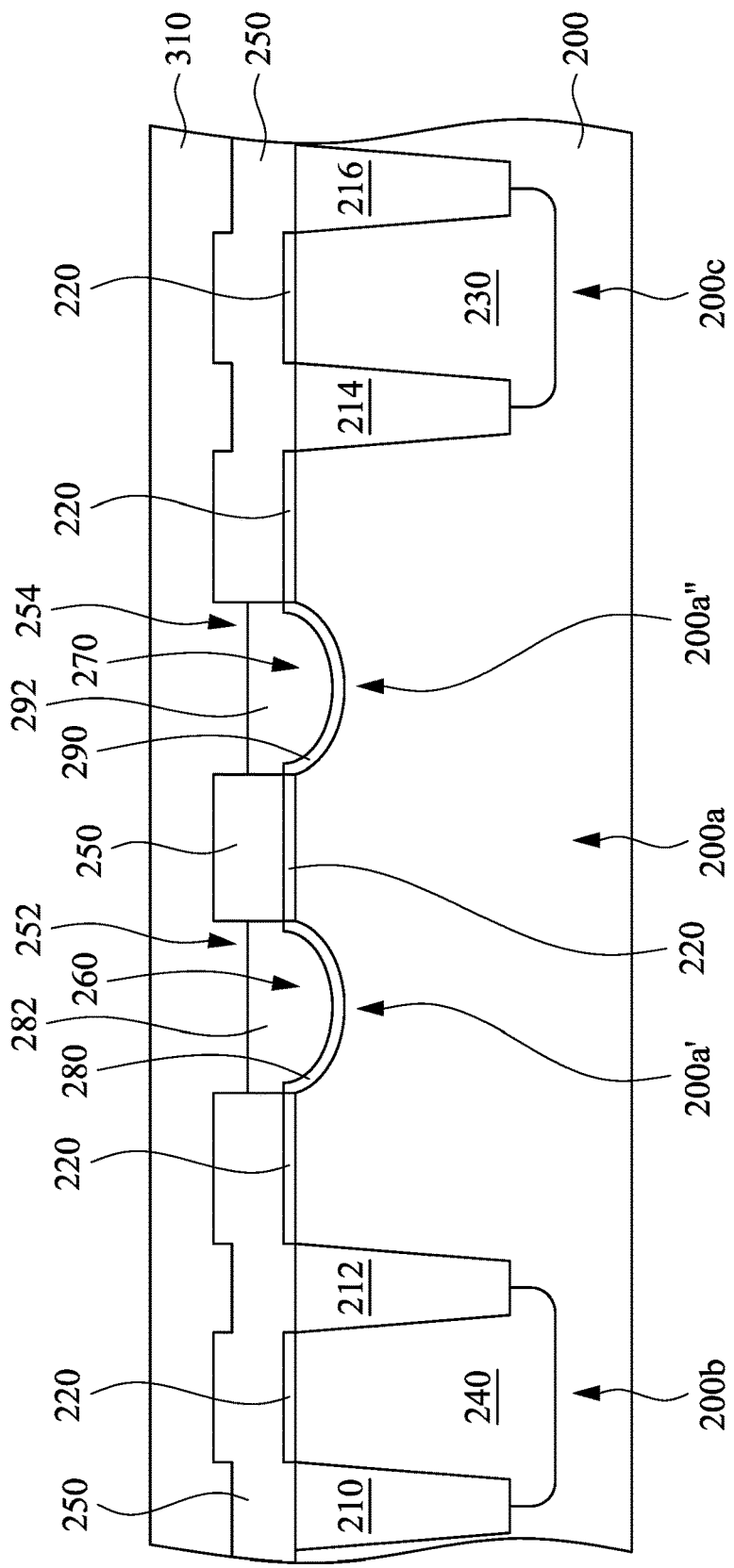

As shown in FIG. 2H, a mask material layer 310 is formed to cover the hard mask layer 250 and the floating gates 282 and 292. The trenches 252 and 254 are filled with the mask material layer 310. For example, the mask material layer 310 may be formed by using a chemical vapor deposition method or a physical vapor deposition method. The mask material layer 310 may be formed from silicon oxide.

Figure 2I:
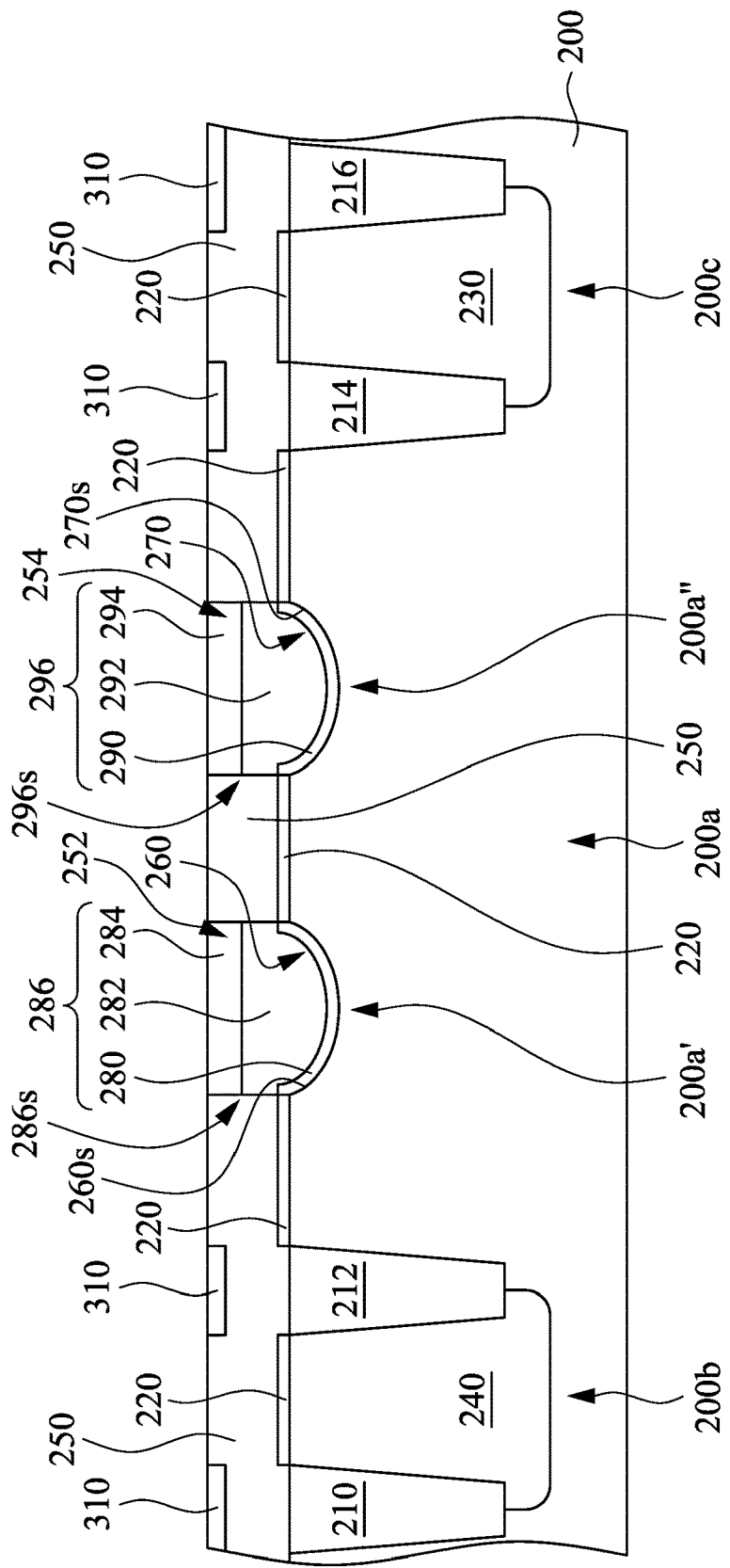

As shown in FIG. 2I, a planarization process may be optionally performed on the mask material layer 310 by, for example, a chemical mechanical polishing technique. The planarization process is performed to remove portions of the mask material layer 310. The planarization process may stop on the top of the hard mask layer 250. After the planarization process is completed, portions of the mask material layer 310 remaining in the trenches 252 and 254 respectively form mask layers 284 and 294. Referring to FIG. 2I, the mask layer 284 is disposed on the floating gate 282, the floating gate 282 is disposed on the gate dielectric layer 280 in the recess 260, and the gate dielectric layer 280 covers the surface 260s of the recess 260 to form a first floating gate structure 286 in the recess 260. The mask layer 294 is disposed on the floating gate 292, the floating gate 292 is disposed on the gate dielectric layer 290 in the recess 270, and the gate dielectric layer 290 covers the surface 270s of the recess 270 to form a second floating gate structure 296 in the recess 270.

Figure 2J:
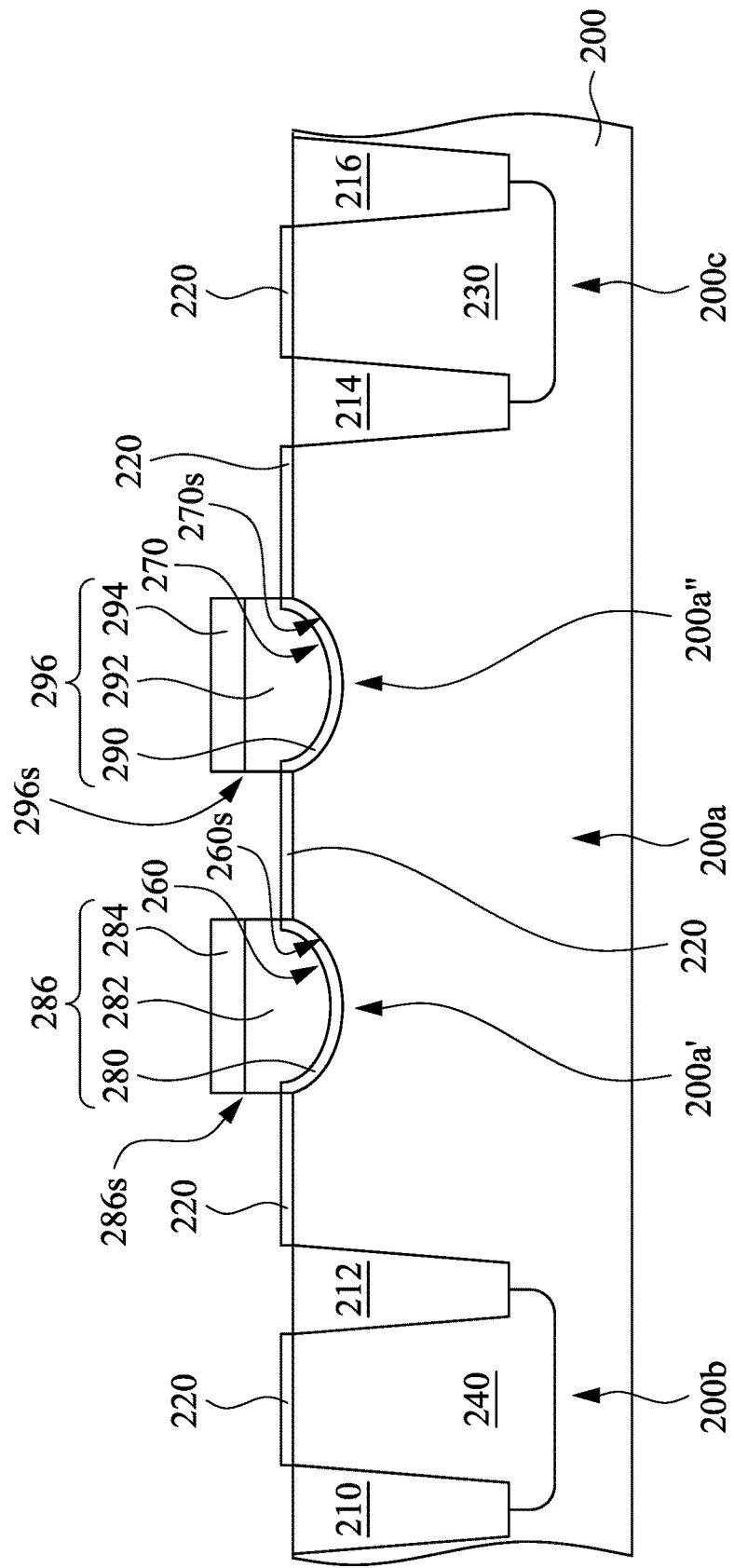

As shown in FIG. 2I and FIG. 2J, the mask material layer 310 remaining on the hard mask layer 250 and the hard mask layer 250 are removed by using, for example, an etch technique. In some exemplary examples, the mask material layer 310 remaining on the hard mask layer 250 is removed, and the hard mask layer 250 is then removed to expose a sidewall 286s of the first floating gate structure 286, a sidewall 286s of the second floating gate structure 296, the pad oxide layer 220, and the isolation structures 210, 212, 214, and 216.

Figure 2K:
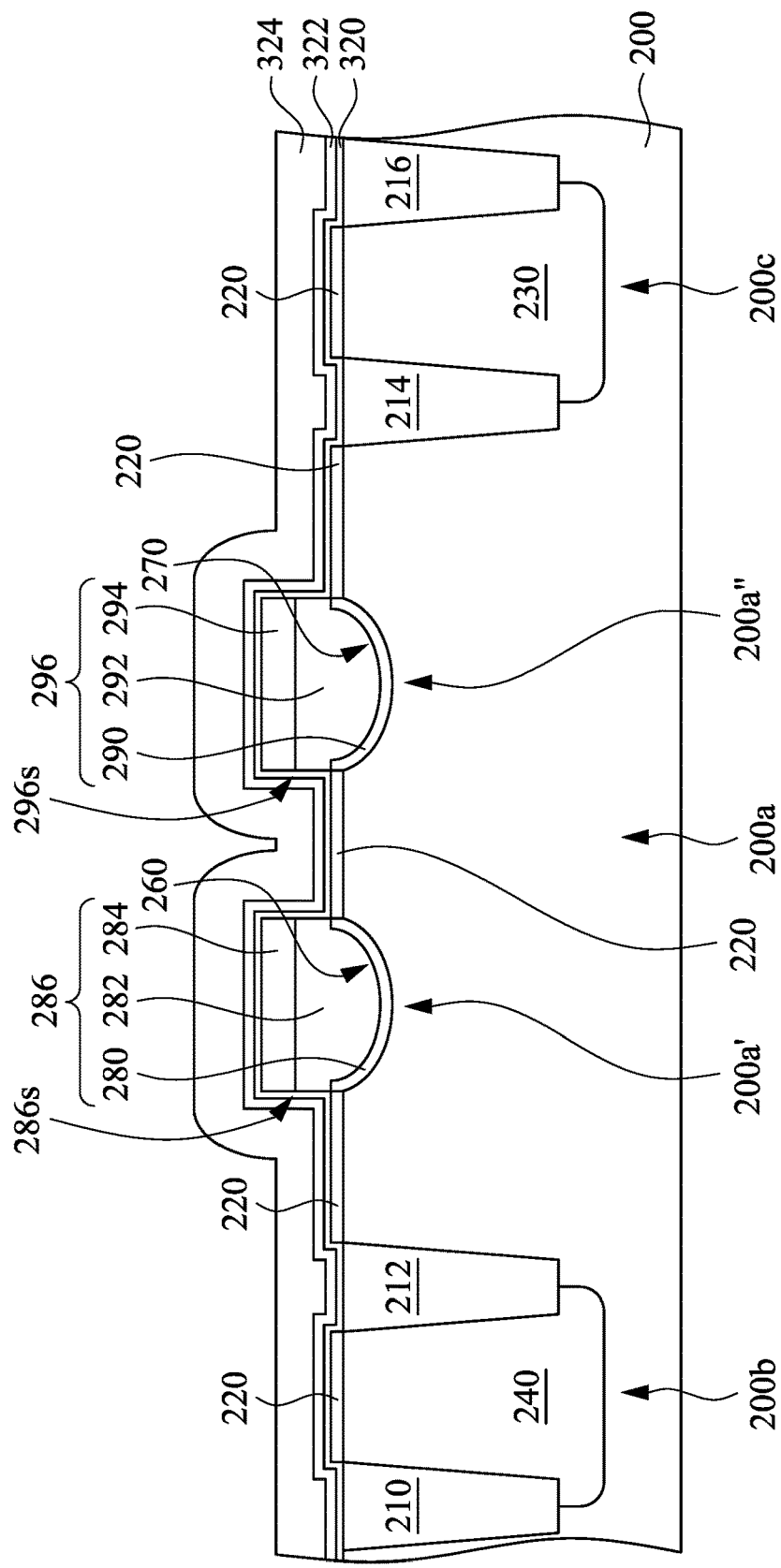

As shown in FIG. 2K, a first dielectric layer 320 is formed to cover the first floating gate structure 286, the second floating gate structure 296, the pad oxide layer 220, and the isolation structures 210, 212, 214, and 216. For example, the first dielectric layer 320 may be formed by using a chemical vapor deposition method. The first dielectric layer 320 may be formed from silicon oxide. A second dielectric layer 322 is formed to cover the first dielectric layer 320. For example, the second dielectric layer 322 may be formed by using a chemical vapor deposition method. The second dielectric layer 322 may be formed from silicon nitride. A third dielectric layer 324 is formed to cover the second dielectric layer 322. For example, the third dielectric layer 324 may be formed by using a chemical vapor deposition method. The third dielectric layer 324 may be formed from silicon oxide.

Figure 2L:
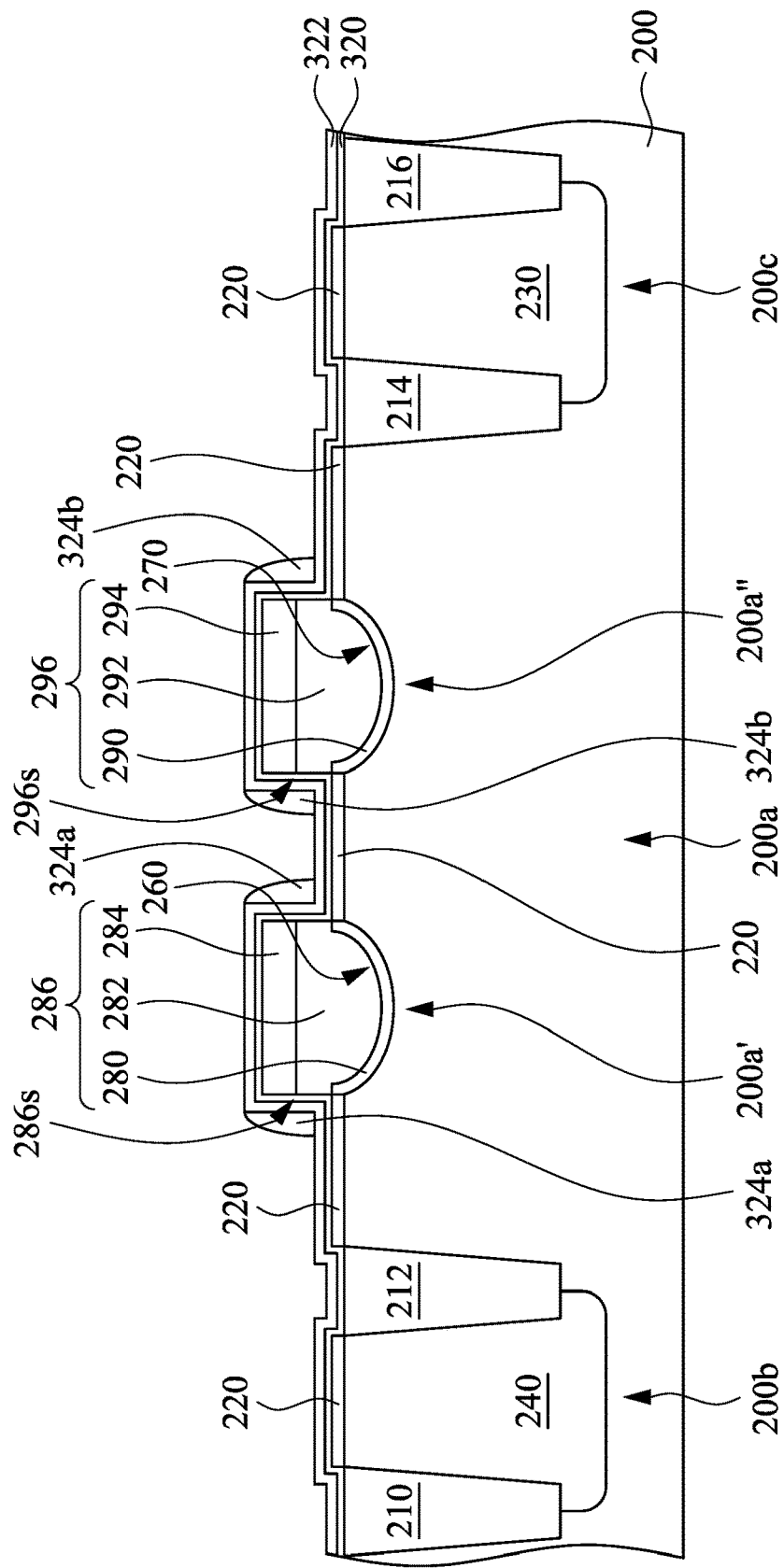

As shown in FIG. 2L, an etch back process is performed on the third dielectric layer 324 by using an etch technique, such as a dry etch technique. The etch back process removes a portion of the third dielectric layer 324 and stops on the second dielectric layer 322, so as to form two spacers 324*a* on the second dielectric layer 322 adjacent to the sidewall 286*s* of the first floating gate structure 286, and two spacers 324*b* on the second dielectric layer 322 adjacent to the sidewall 296*s* of the second floating gate structure 296. The spacers 324*a* are respectively located on two opposite sides of the first floating gate structure 286, and the spacers 324*b* are respectively located on two opposite sides of the second floating gate structure 296.

Figure 2M:
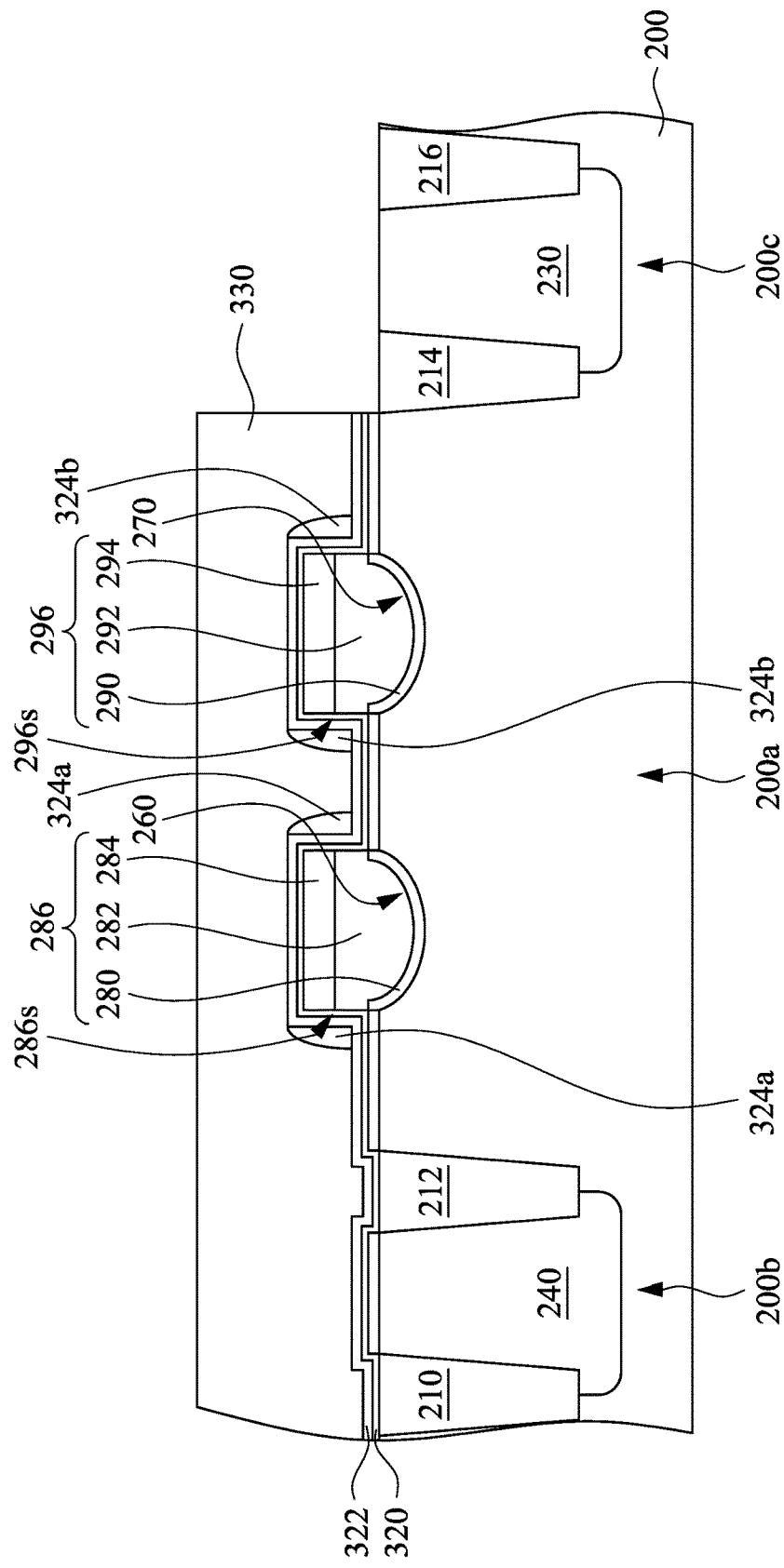

As shown in FIG. 2M, the second dielectric layer 322, the first dielectric layer 320, and the pad oxide layer 220 in the third region 200*c* are removed. In some examples, an etch mask layer 330 is formed to cover the first region 200*a* and the second region 200*b*. The etch mask layer 330 may be formed from photo-resist, and the etch mask layer 330 may be formed by coating an etch mask material film on the first region 200*a*, the second region 200*b*, and the third region 200*c*, and removing a portion of the etch mask material film which is located on the third region 200*c* using a photolithography technique. In some exemplary examples, after the etch mask layer 330 is formed, the second dielectric layer 322 on the third region 200*c* is removed by, for example, a dry etch technique. The first dielectric layer 320 on the third region 200*c* is etched by using a dry etch technique. Then, the pad oxide layer 220 on the third region 200*c* is etched by using a wet etch technique. The etch mask layer 330 is removed.

Figure 2N:
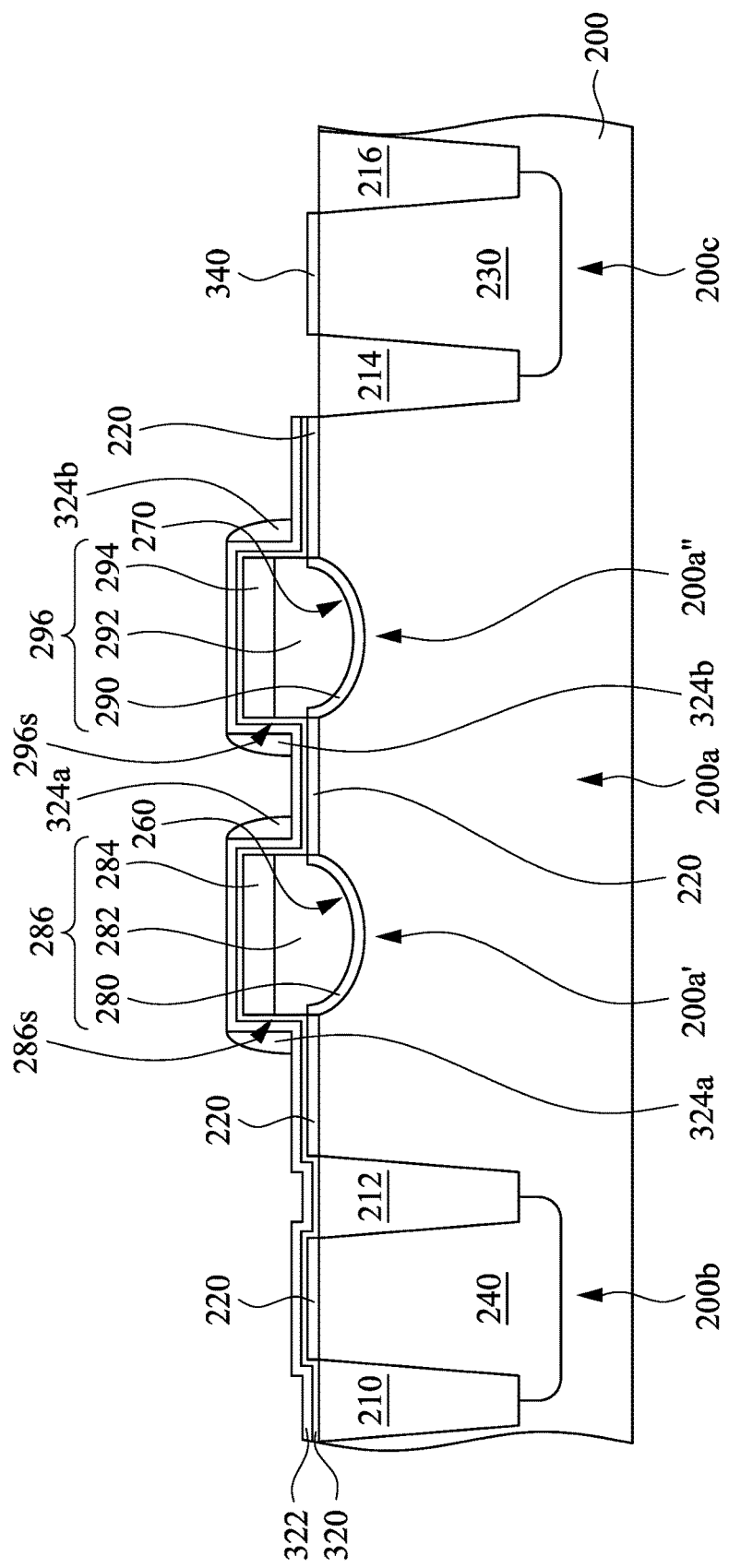

As shown in FIG. 2N, a dielectric layer 340 is formed on the high voltage well 230 between the isolation structures 214 and 216. The dielectric layer 340 may be referred to a high voltage gate dielectric layer. For example, the dielectric layer 340 may be formed by a deposition technique or an oxidization technique. In some exemplary examples, the dielectric layer 340 is formed by oxidizing the substrate 200, and the dielectric layer 340 is formed from silicon oxide. For example, the dielectric layer 340 may be formed by a furnace oxidization process.

Figure 2O:
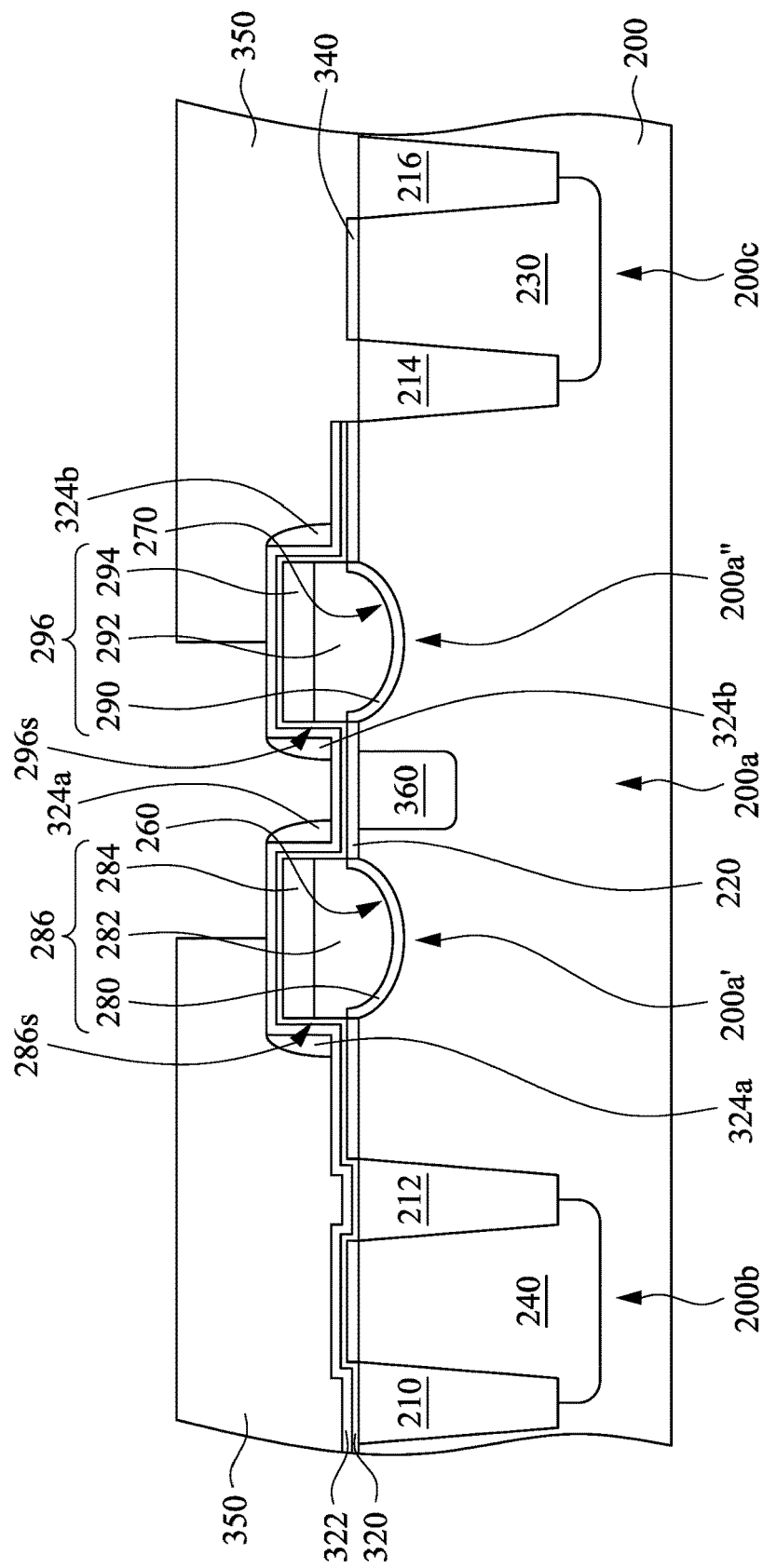

As shown in FIG. 2O, a hard mask layer 350 is formed on the first region 200*a*, the second region 200*b*, and the third region 200*c*, and the hard mask layer 350 is formed to have a through hole 352. The through hole 352 exposes one of the spacers 324*a* which is far away the second region 200*b*, one of the spacers 324*b* which is far away the third region 200*c*, and a portion of the second dielectric layer 322 which extends from a middle region of the first floating gate structure 286 to a middle region of the second floating gate structure 296. The hard mask layer 350 covers the second region 200*b* and the third region 200*c*, and portions of the first region 200*a* which are respectively adjacent to the second region 200*b* and the third region 200*c*. In some exemplary examples, the hard mask layer 350 may be formed from photo-resist, and the hard mask layer 350 may be formed by coating a mask material film on the first region 200*a*, the second region 200*b*, and the third region 200*c*, and removing a portion of the mask material film to form the hard mask layer 350 having the through hole 352. The through hole 352 exposes the second dielectric layer 322 between the adjacent spacers 324*a* and 324*b*, which are located between the first floating gate structure 286 and the second floating gate structure 296.

In some examples, referring to FIG. 2O again, an implantation process is performed on the substrate 200 by using the hard mask layer 350, the exposed spacers 324*a* and 324*b*, and the exposed second dielectric layer 322 on the first floating gate structure 286 and the second floating gate structure 296 as a mask. The implantation process includes forming an implantation region in the substrate 200 between the adjacent spacers 324*a* and 324*b*. A furnace process may be optionally performed to oxidize the implantation region, so as to form a common source 360 between the first floating gate structure 286 and the second floating gate structure 296. The common source 360 includes dopants, such as boron and phosphorous.

Figure 2P:
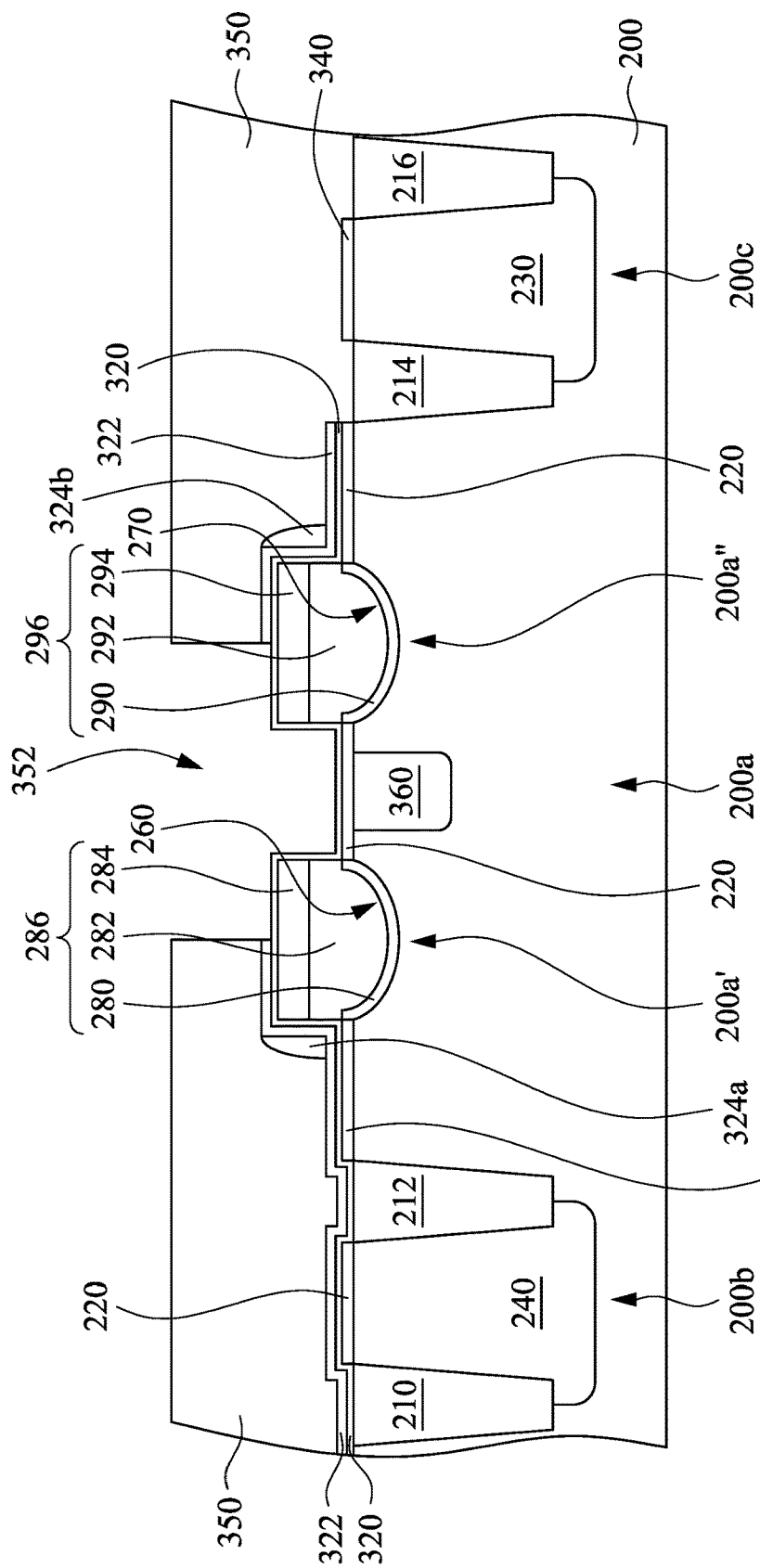

As shown in FIG. 2P, the exposed spacer 324*a* and the exposed spacer 324*b* are removed by using an etch technique. For example, the exposed spacer 324*a* and the exposed spacer 324*b* may be removed by using a wet etch technique. The exposed second dielectric layer 322 is removed by using an etch technique. For example, the exposed second dielectric layer 322 may be removed by a dry etch technique. The etching of the exposed second dielectric layer 322 stops on the first dielectric layer 320, such that a portion of the first dielectric layer 320 underlying the exposed second dielectric layer 322 is exposed.

Figure 2Q:
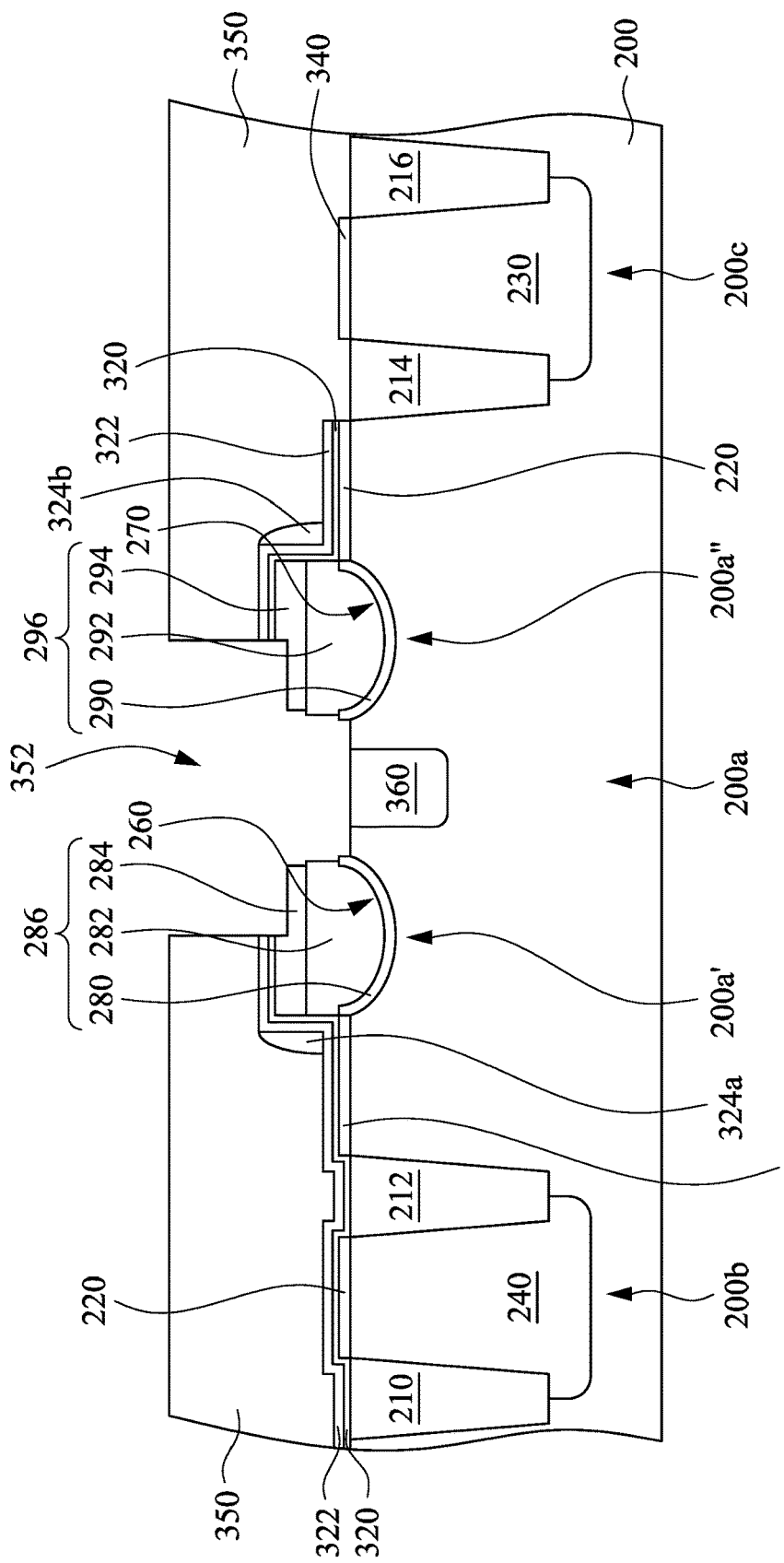

As shown in FIG. 2Q, the exposed first dielectric layer 320 is removed to expose a portion of the first floating gate structure 286, a portion of the second floating gate structure 296, a portion of the substrate 200 between the first floating gate structure 286 and the second floating gate structure 296. The exposed first dielectric layer 320 is removed by an etch process. For example, the etch process may be a wet etch process. After removing of the exposed first dielectric layer 320 is completed, the hard mask layer 350 is removed by, for example, a stripping technique.

Figure 2R:
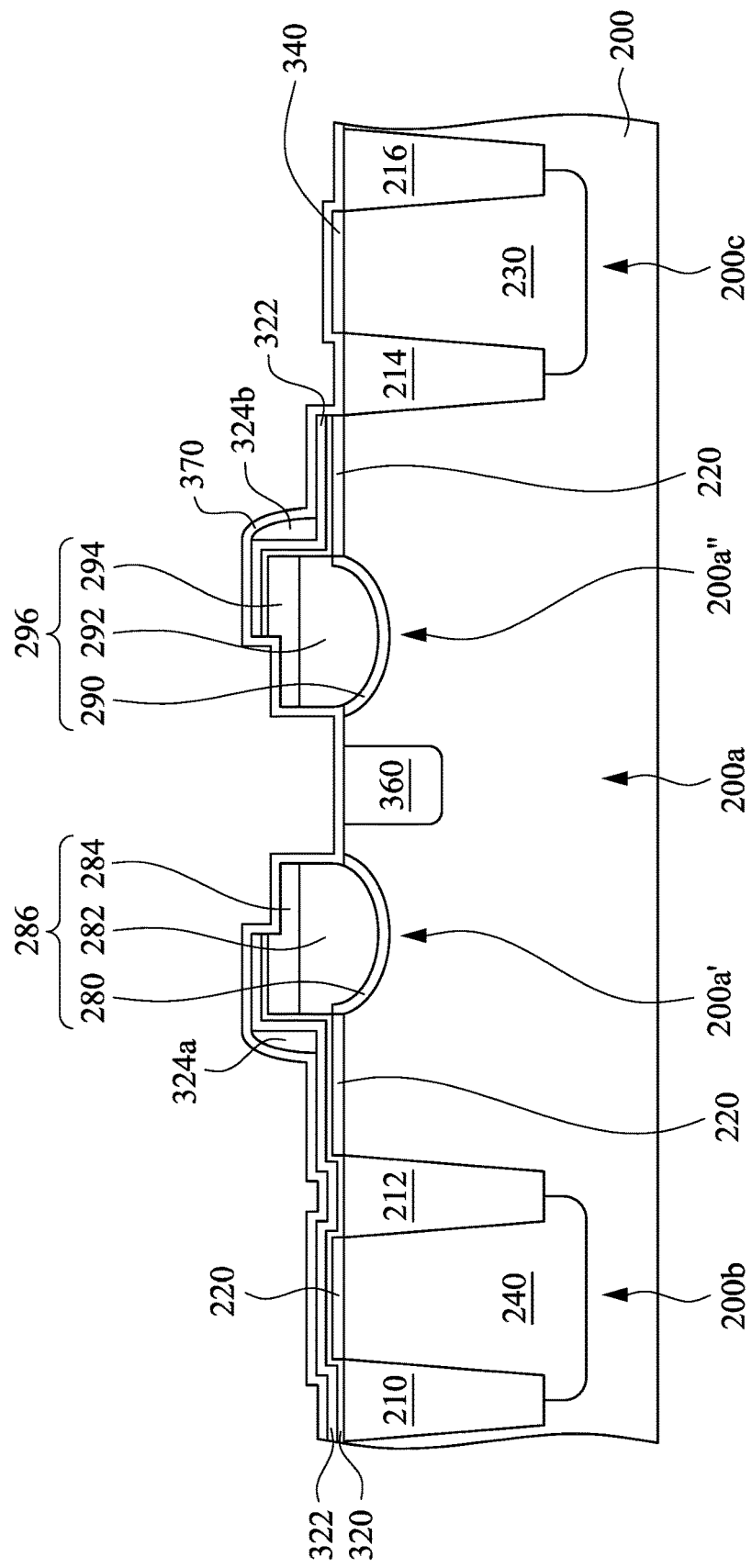

As shown in FIG. 2R, an erase tunnel dielectric layer 370 is formed to cover the second dielectric layer 322, the exposed portion of the first floating gate structure 286, the exposed portion of the second floating gate structure 296, the exposed portion of the substrate 200, the isolation structures 214 and 216, and the dielectric layer 340. The erase tunnel dielectric layer 370 is formed by a deposition process, such as a chemical vapor deposition process or a physical vapor deposition process. For example, the erase tunnel dielectric layer 370 may be formed from silicon oxide.

Figure 2S:
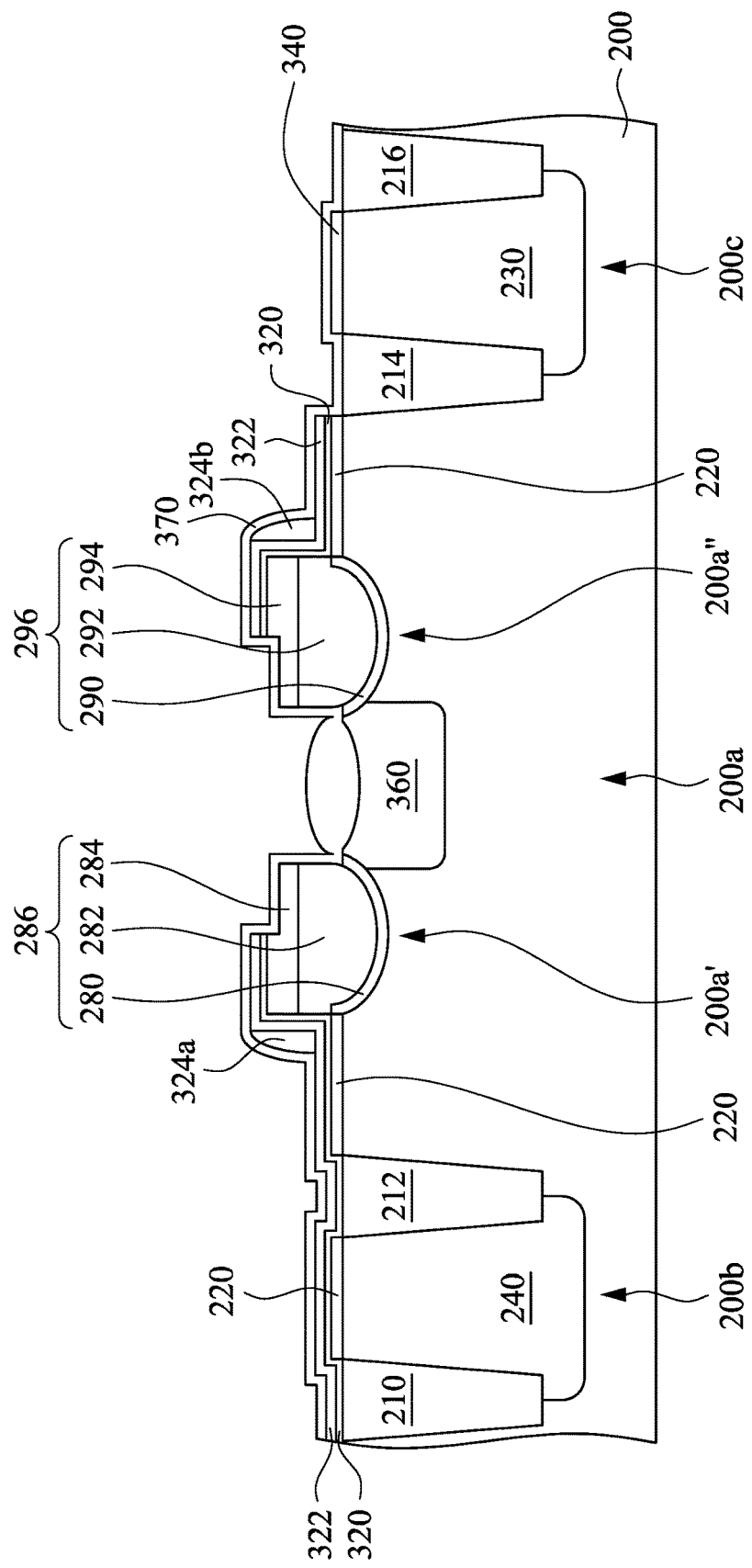

As shown in FIG. 2S, an oxidization process for the common source 360 is performed. In the oxidization process, the dopants in the common source 360 diffuse, and a portion of the common source 360 adjacent to the erase tunnel dielectric layer 370 is oxidized, such that the common source 360 is enlarged, and the erase tunnel dielectric layer 370 on the common source 360 is thickened.

Figure 2T:
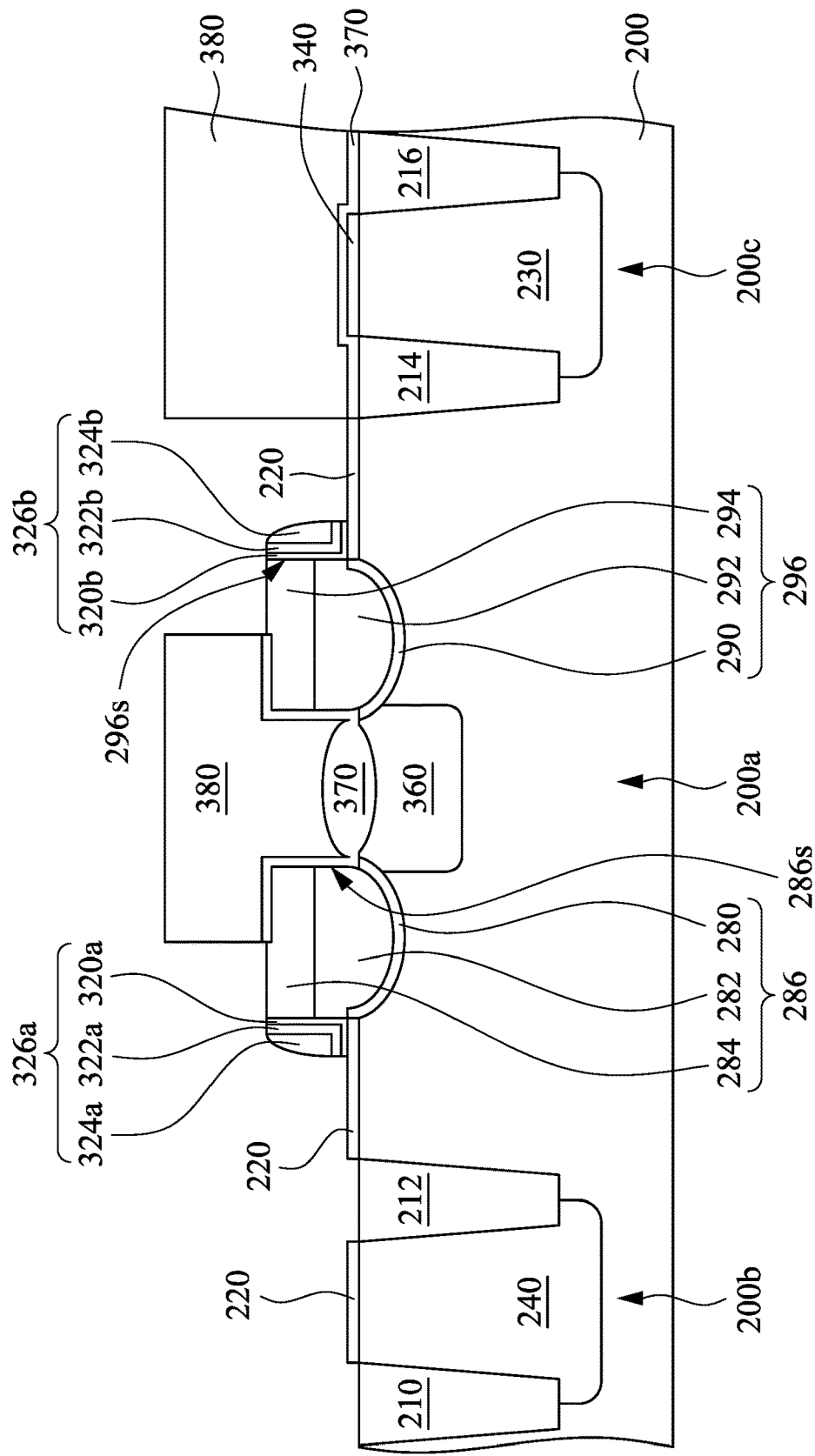

As shown in FIG. 2T, a hard mask layer 380 is formed on a portion of the erase tunnel dielectric layer 370 on the third region 200*c*, and another portion of the erase tunnel dielectric layer 370 which extends from the middle region of the first floating gate structure 286 to the middle region of the second floating gate structure 296 through the common source 360. In some exemplary examples, the hard mask layer 380 may be formed from photo-resist, and the hard mask layer 380 may be formed by coating a mask material film on the first region 200*a*, the second region 200*b*, and the third region 200c, and removing portions of the etch mask material film to form the hard mask layer 380.

Referring to FIG. 2T again, a dry etch process is performed by using the hard mask layer 380 as an etch mask. The dry etch process removes the erase tunnel dielectric layer 370, the second dielectric layer 322, and the first dielectric layer 320 on the second region 200b. The dry etch process further removes the erase tunnel dielectric layer 370, the second dielectric layer 322, and the first dielectric layer 320 on the first region 200a which are not covered by the hard mask layer 380. The spacers 324a and 324b are covered by portions of the erase tunnel dielectric layer 370 with a greater thickness, such that the spacers 324a and 324b and the underlying second dielectric layer 322 and the first dielectric layer 320 may not be etched during the dry etch process. In some certain examples, the spacers 324a and 324b may be slightly etched.

As shown in FIG. 2T, after the dry etch process, the spacer 324a, and a remaining portion 320a of the first dielectric layer 320 and a remaining portion 322a of the second dielectric layer 322 underlying the spacer 324a form a first spacer 326a. The first spacer 326a is disposed on the pad oxide layer 220 and covers the sidewall 286s of the first floating gate structure 286. In addition, the spacer 324b, and a remaining portion 320b of the first dielectric layer 320 and a remaining portion 322b of the second dielectric layer 322 underlying the spacer 324b form a second spacer 326b. The second spacer 326b is disposed on the pad oxide layer 220 and covers the sidewall 296s of the second floating gate structure 296. The first spacer 326a and the second spacer 326b are opposite to the common source 360. In some exemplary examples, the spacers 324a and 324b are formed from silicon oxide, the remaining portions 322a and 322b of the second dielectric layer 322 are formed from silicon nitride, and the remaining portions 320a and 320b of the first dielectric layer 320 are formed from silicon oxide, such that each of the first spacer 326a and the second spacer 326b includes an oxide-nitride-oxide structure.

Figure 2U:
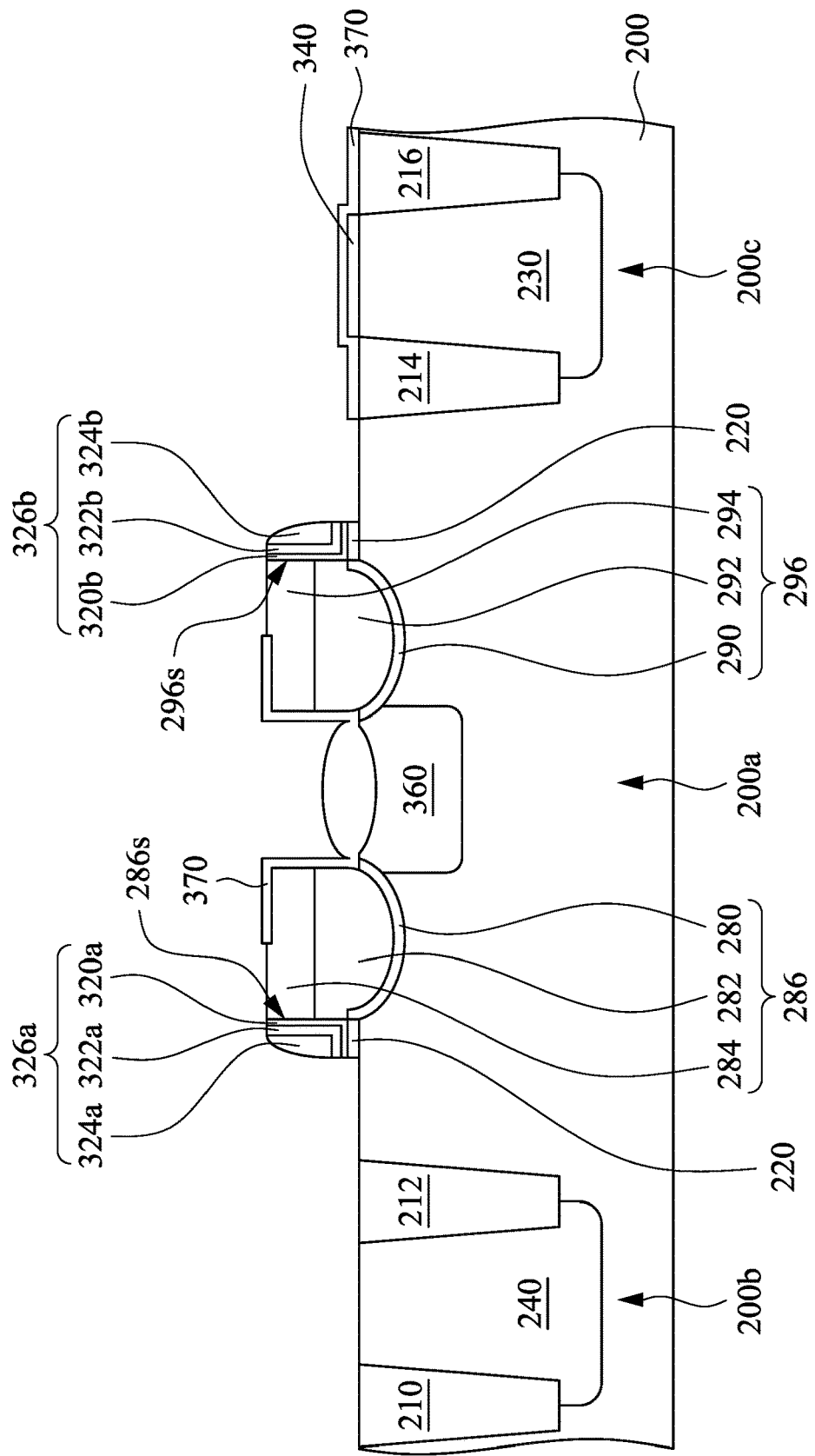

As shown in FIG. 2U, after the dry etch process is completed, portions of the pad oxide layer 220, which are not covered, are removed by an etch method, such as a dry etch method. Then, the hard mask layer 380 is removed by, for example, a strip method.

Figure 2V:
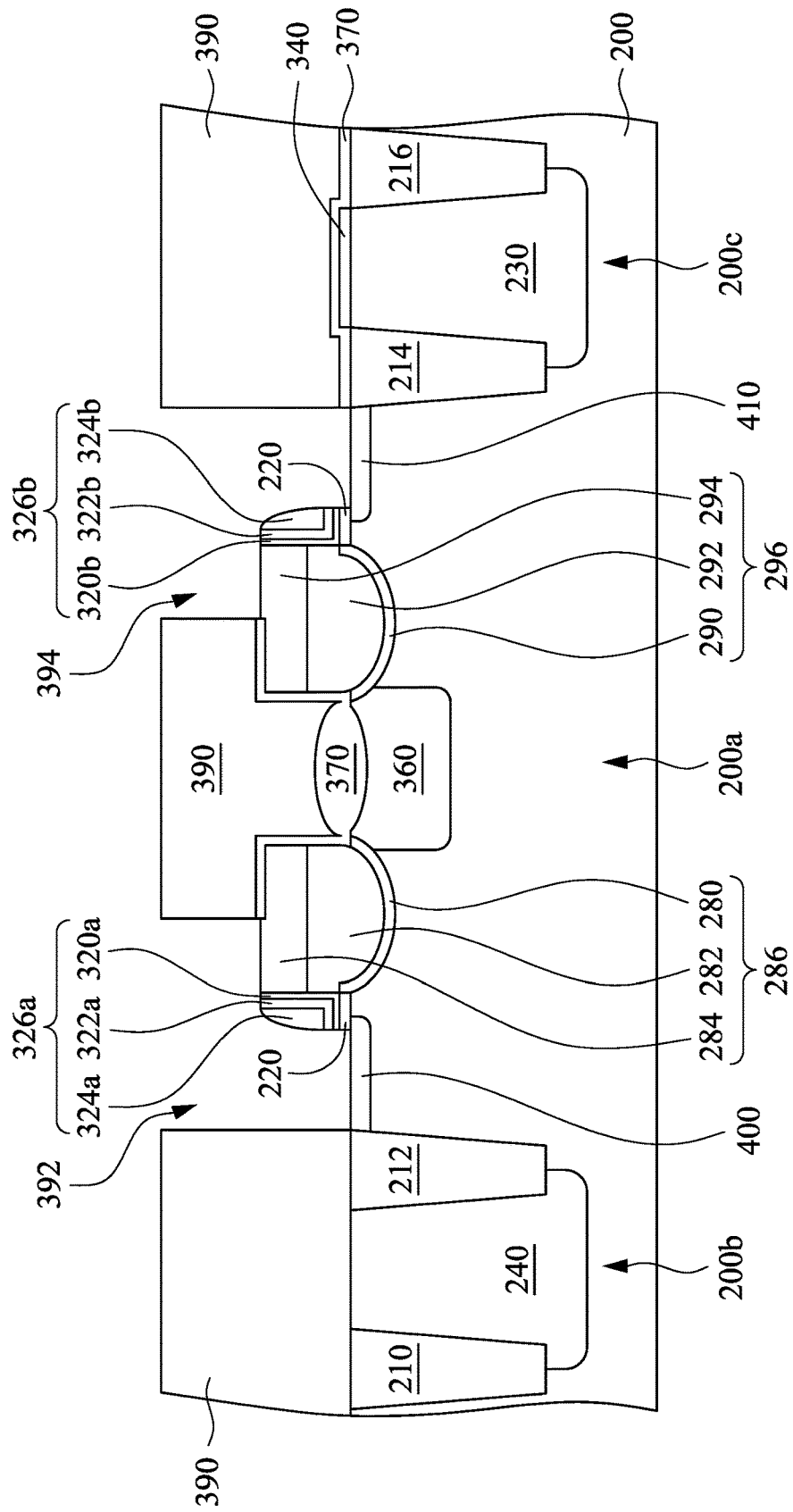

As shown in FIG. 2V, a hard mask layer 390 is formed on the first region 200a, the second region 200b, and the third region 200c, and the hard mask layer 390 is formed to have through holes 392 and 394. The through hole 392 extends from the middle region of the first floating gate structure 286 to the isolation region 212, and the through hole 394 extends from the middle region of the second floating gate structure 296 to the isolation region 214. Thus, the through hole 392 exposes a portion of the first floating gate structure 286 and a portion of the substrate 200 between the first spacer 326a and the isolation structure 212, and the through hole 394 exposes a portion of the second floating gate structure 296 and a portion of the substrate 200 between the second spacer 326b and the isolation structure 214. The hard mask layer 390 covers the second region 200b and the third region 200c, and a middle portion of the first region 200a. In some exemplary examples, the hard mask layer 390 may be formed from photo-resist, and the hard mask layer 390 may be formed by coating a mask material film on the first region 200a, the second region 200b, and the third region 200c, and removing portions of the mask material film to form the hard mask layer 390 having the through holes 392 and 394.

In some examples, referring to FIG. 2V again, an implantation process is performed on the substrate 200 by using the hard mask layer 390, the first spacers 326a and the second spacer 326b, and the exposed portions of the first floating gate structure 286 and the second floating gate structure 296 as a mask. The implantation process includes forming implantation regions 400 and 410 in the substrate 200, in which the implantation region 400 is located between the first spacer 326a and the isolation structure 212, and the implantation region 410 is located between the second spacer 326b and the isolation structure 214. The implantation regions 400 and 410 include dopants, such as boron and phosphorous.

Figure 2W:
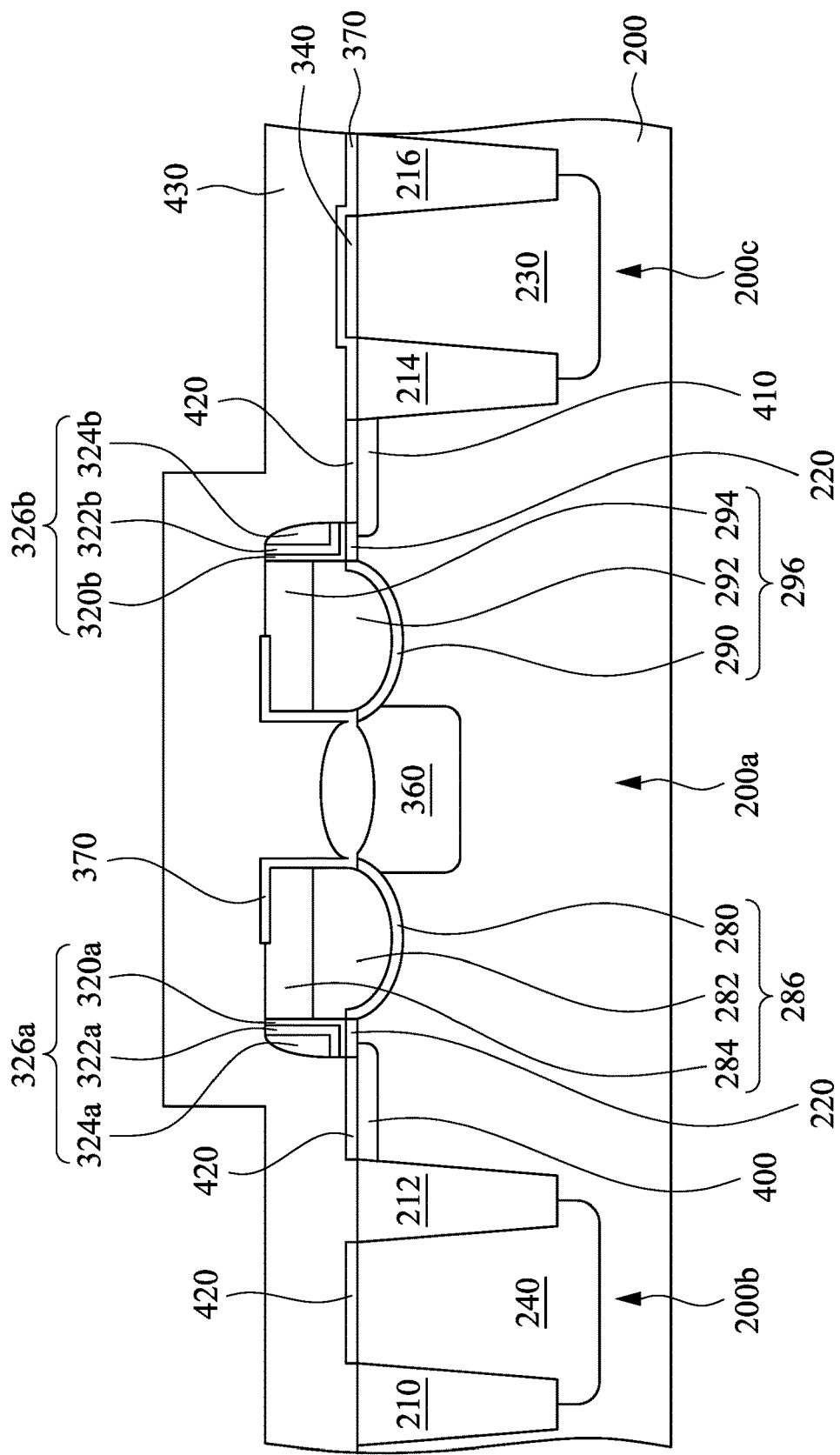

As shown in FIG. 2W, dielectric layers 420 are formed on the logic well 240 between the isolation structures 210 and 212, the implantation regions 400 and 410. The dielectric layers 420 may be referred as a low voltage gate dielectric layer. For example, the dielectric layer 420 may be formed by a deposition technique or an oxidization technique. In some exemplary examples, the dielectric layers 420 are formed by oxidizing the substrate 200, and the dielectric layers 420 are formed from silicon oxide. For example, the dielectric layers 420 may be formed by a furnace oxidization process.

Referring to FIG. 2W again, a conductive layer 430 is formed to cover the first region 200a, the second region 200b, and the third region 200c. The conductive layer 430 may be formed by using a deposition method, such as a chemical vapor deposition method, a plasma-enhanced chemical vapor deposition method, or a physical vapor deposition method. In some exemplary examples, the conductive layer 430 is formed from polysilicon.

Figure 2X:
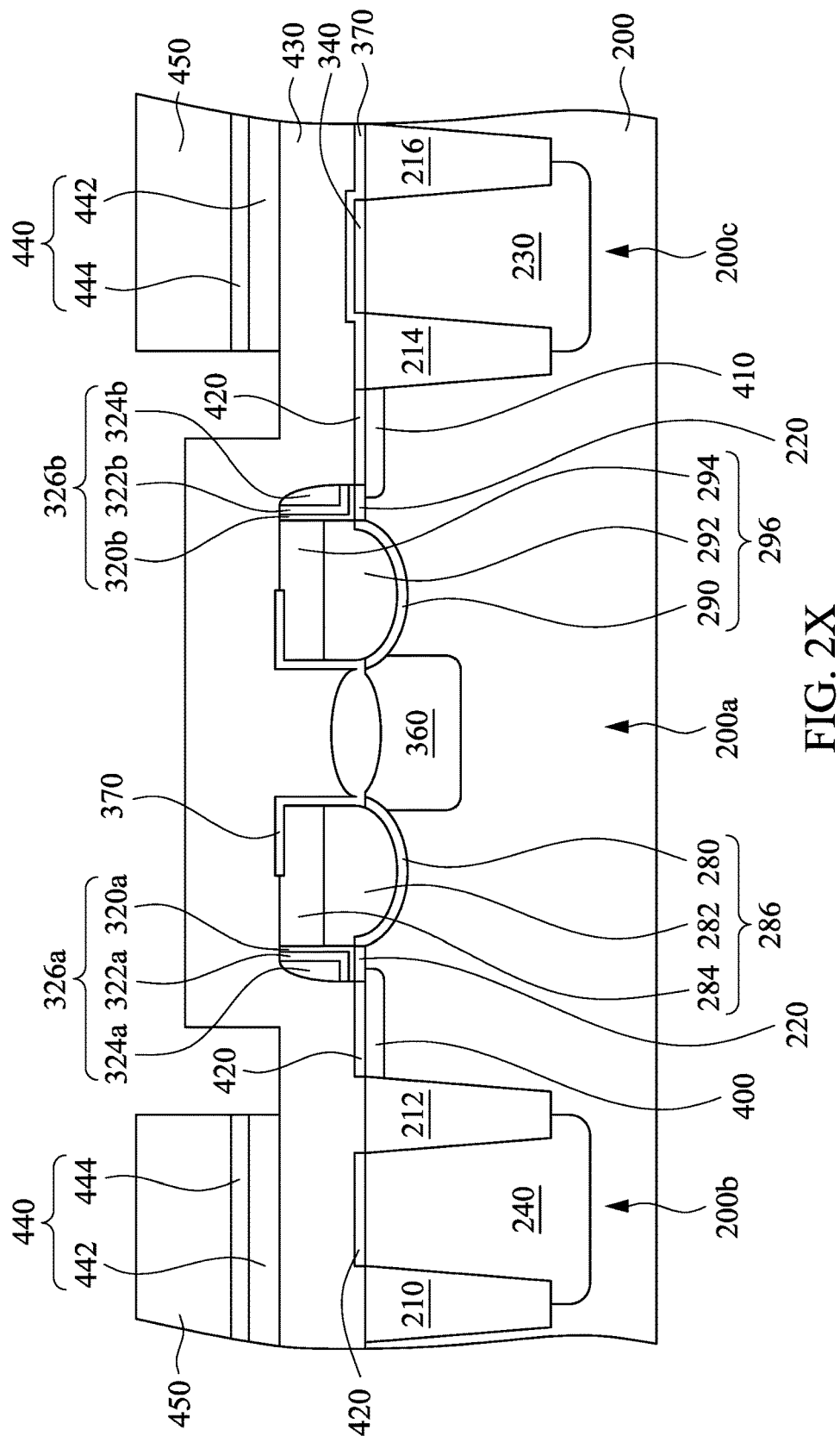

As shown in FIG. 2X, a hard mask structure 440 is formed on the conductive layer 430 on the second region 200b and the third region 200c. In some exemplary examples, the hard mask structure 440 is a two-layered structure. The hard mask structure 440 includes dielectric layers 442 and 444, in which the dielectric layer 442 is disposed on the conductive layer 430, and the dielectric layer 444 is disposed on the dielectric layer 442. For example, the dielectric layer 442 may be formed from silicon nitride, and the dielectric layer 444 is formed from silicon oxide by using tetraethyl orthosilicate (TEOS). In some exemplary examples, in forming the hard mask structure 440, the dielectric layer 442 is formed to blanketly cover the conductive layer 430, the dielectric layer 444 is formed to blanketly cover the dielectric layer 444, then an etch mask 450 is formed on the dielectric layer 444 on the second region 200b and the third region 200c, and an etch process is performed on the dielectric layer 444, which is not covered by the etch mask 450, and the underlying dielectric layer 442 to form the hard mask structure 440. The dielectric layer 442 may be formed by using a chemical vapor deposition method or a physical vapor deposition. The dielectric layer 444 may be formed by using a chemical vapor deposition method. The etch mask 450 may be formed from photo-resist. After the etch process is completed, the etch mask 450 may be removed by a strip process.

Figure 2Y:
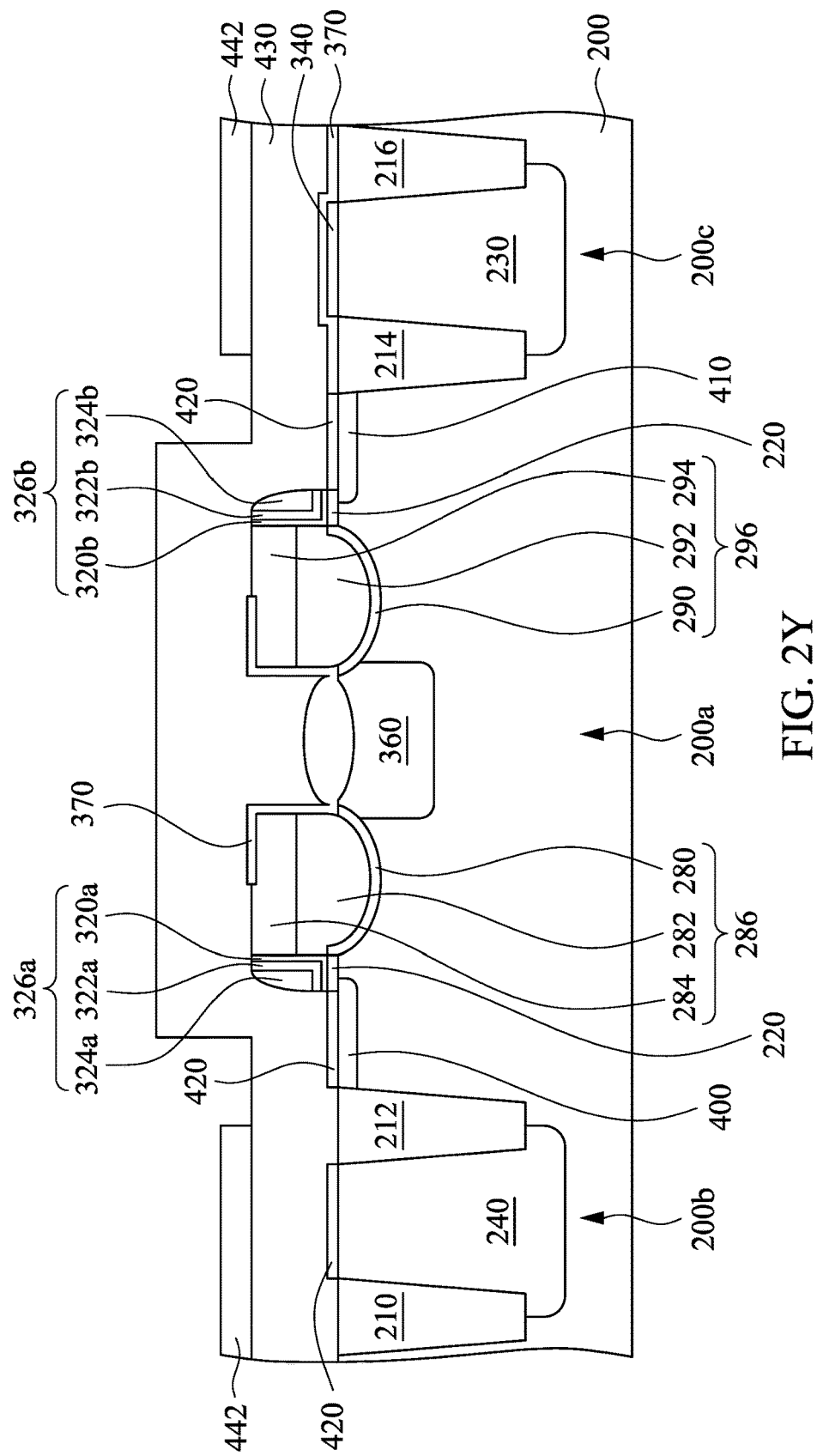

As shown in FIG. 2Y, the dielectric layer 444 of the hard mask structure 440 may be optionally removed. In some exemplary examples, the dielectric layer 444 is removed by a wet process. For example, the dielectric layer 444 may be removed by dipping in a solution of hydrogen fluoride (HF).

Figure 2Z:
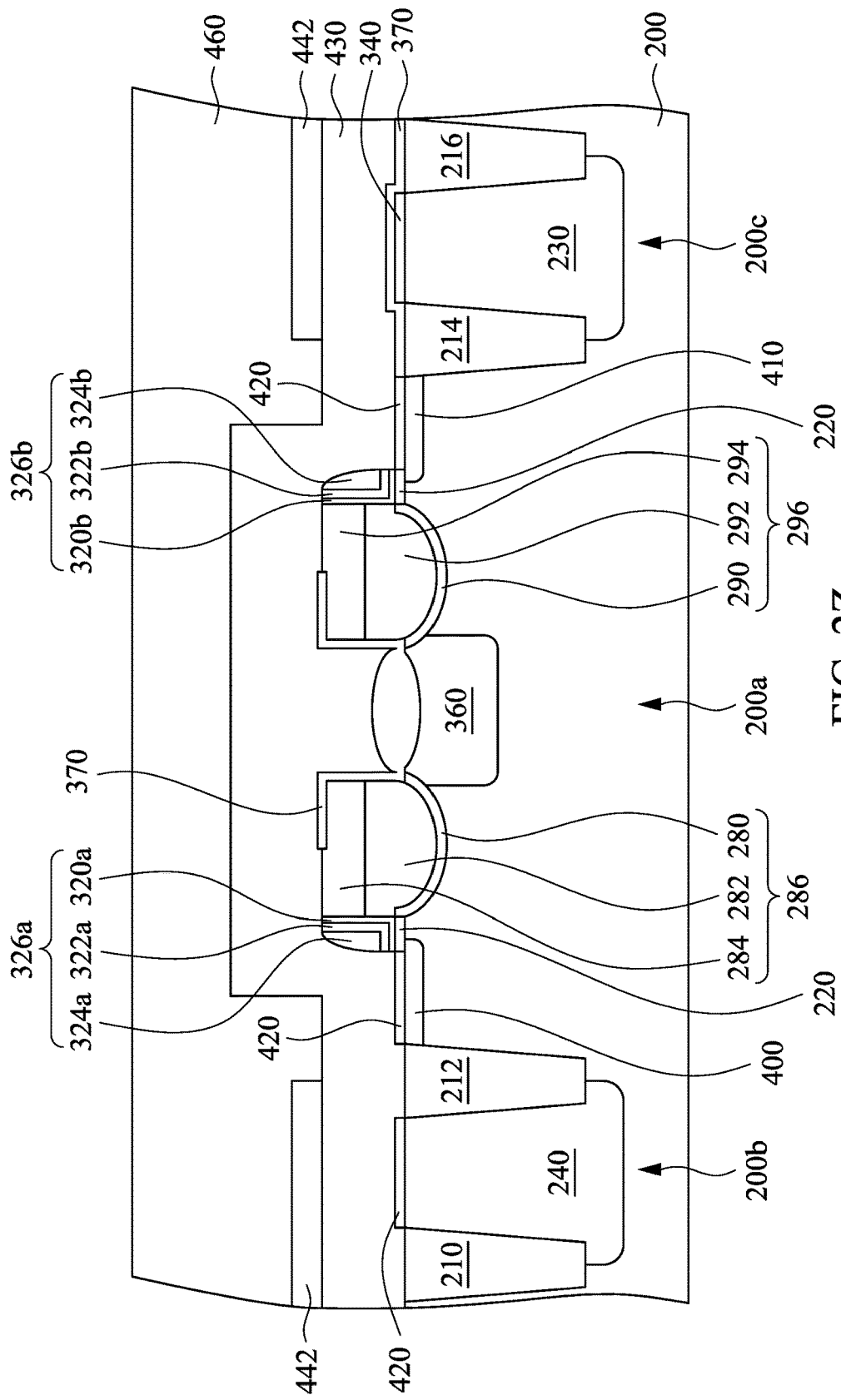

As shown in FIG. 2Z, in some examples, a buffer layer 460 is formed to cover the dielectric layer 442 of the hard mask structure 440 and the conductive layer 430. For examples, the buffer layer 460 may be formed by a coating method. A top surface 460t of the buffer layer 460 is substantially flat.

Figure 3A:
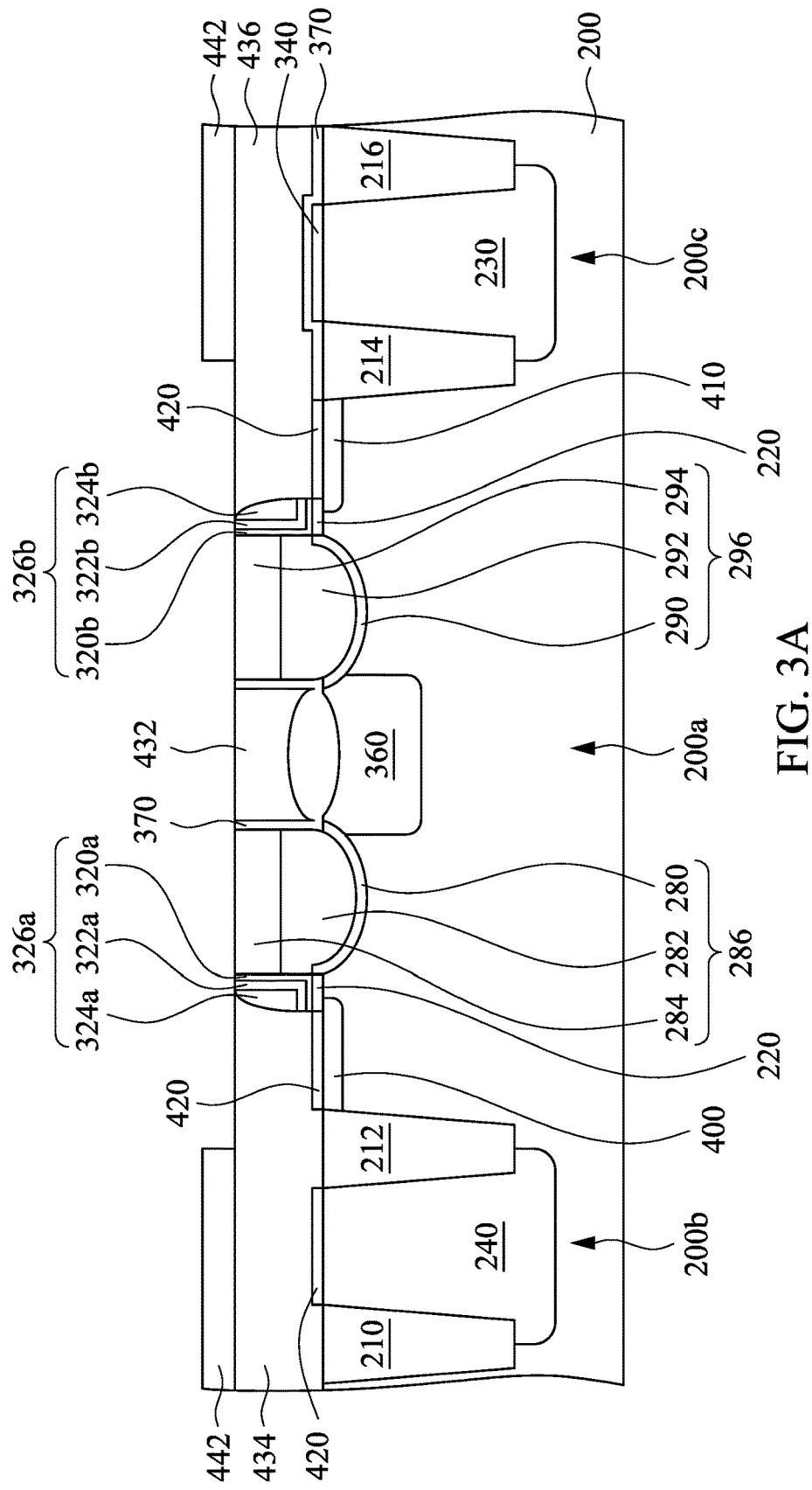

As shown in FIG. 3A, the buffer layer 460 and a portion of the conductive layer 430 are removed. In some examples, the buffer layer 460 and the portion of the conductive layer 430 are removed by a blanket etch back process or a chemical mechanical polishing process. After the buffer layer 460 and the portion of the conductive layer 430 are removed, the conductive layer 430 on the first region 200a is substantially planarized. After the portion of the conductive layer 430 is removed, portions of the conductive layer 430 are remained. One of the remaining portions of the conductive layer 430 is disposed on the erase tunnel dielectric layer 370 over the common source 360 and forms an erase gate 432. Another remaining portion 434 of the conductive layer 430 extends from the first spacer 326a to the second region 200b, and the other remaining portion 436 of the conductive layer 430 extends from the second spacer 326b to the third region 200c. The erase gate 432 is separated from the portion 434 by the first spacer 326a, and the erase gate 432 is separated from the portion 436 by the second spacer 326b. The erase gate 432 is separated from the first floating gate structure 286 and the second floating gate structure 296 by the erase tunnel dielectric layer 370.

Figure 3B:
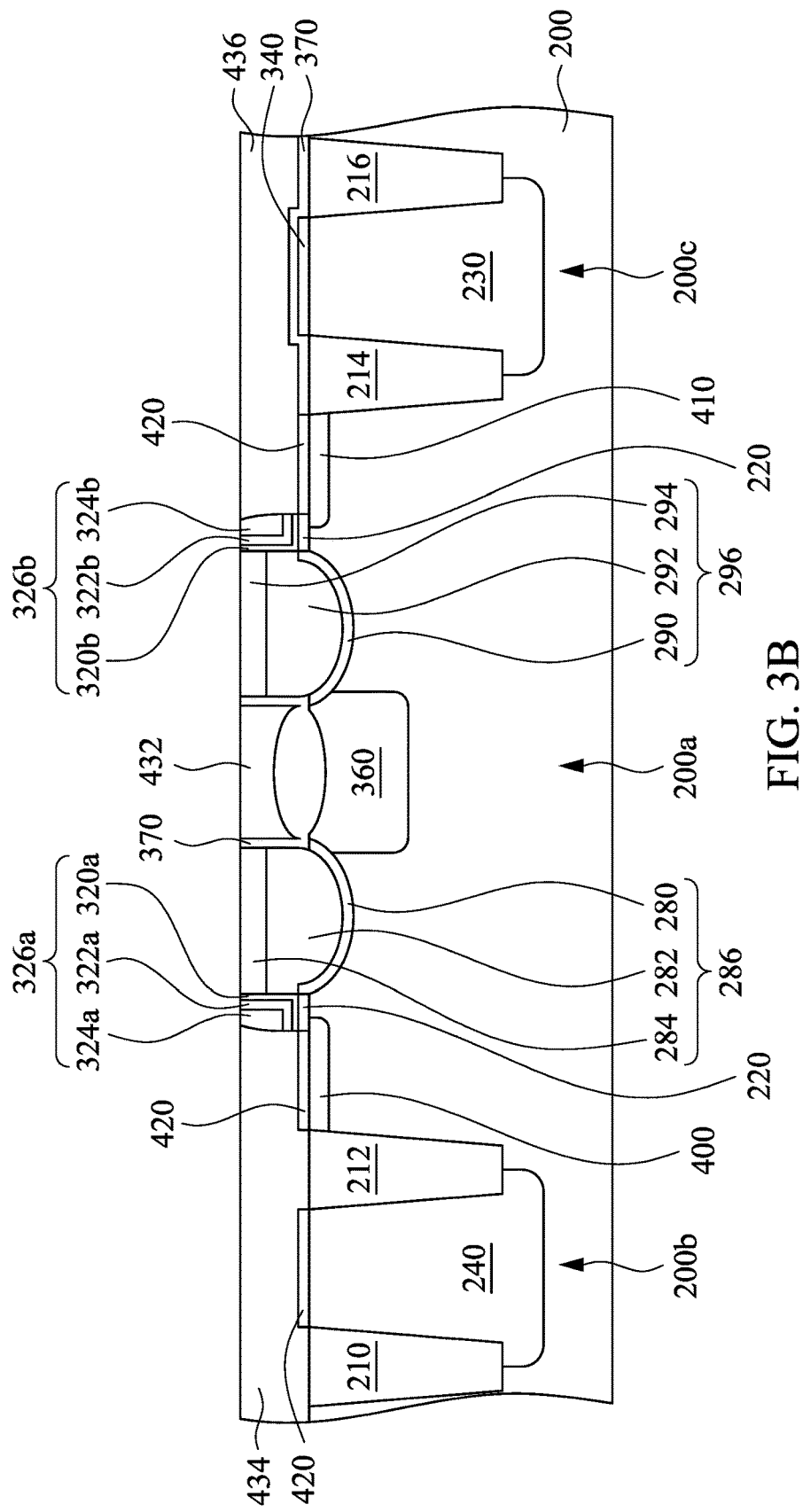

As shown in FIG. 3B, the dielectric layer 442 of the hard mask structure 440 over the second region 200b and the third region 200c is removed by using an etch process. For example, the etch process may be a dry etch process or a wet etch process.

Figure 3C:
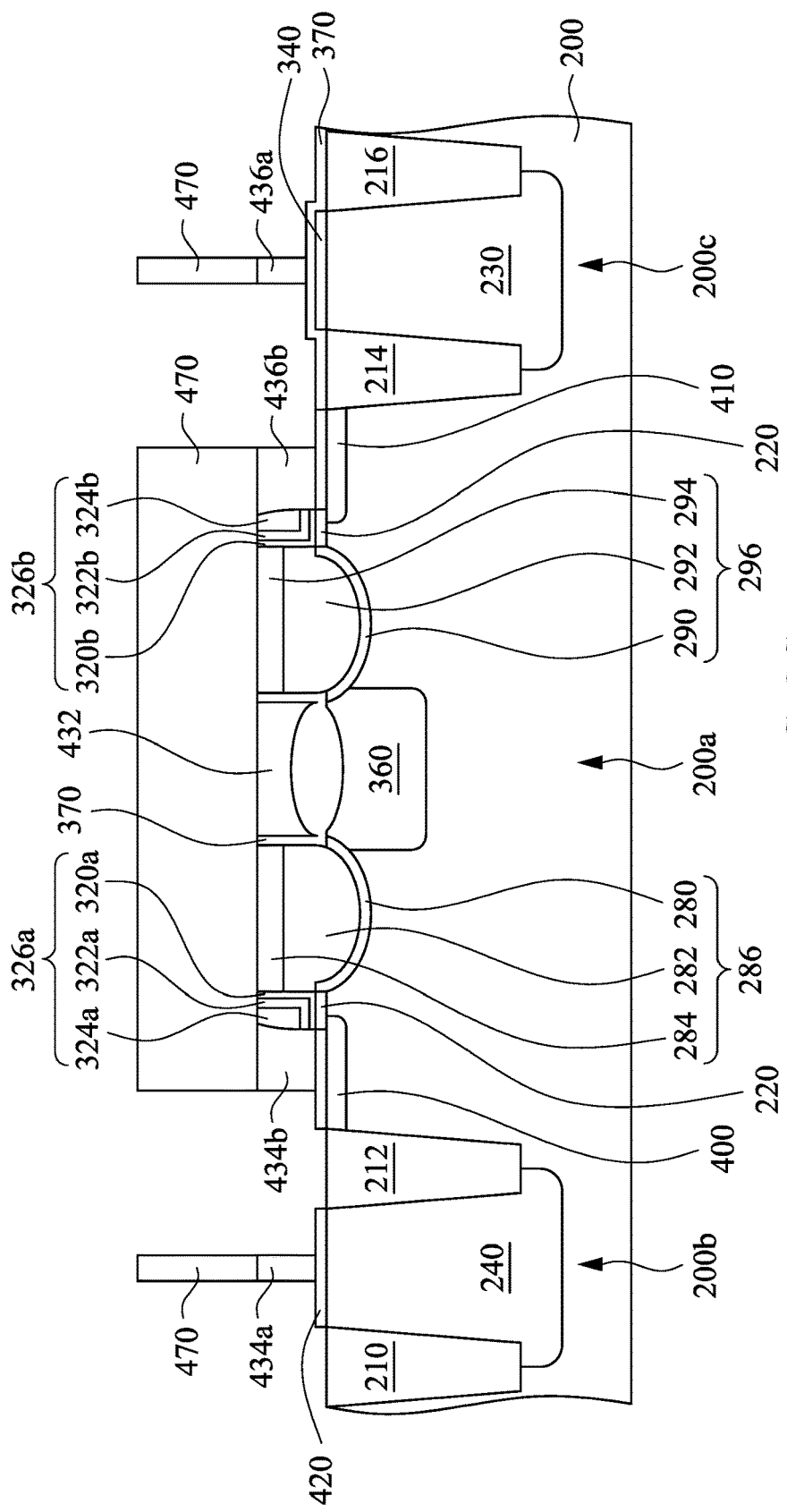

As shown in FIG. 3C, a hard mask layer 470 is formed on the erase gate 432, the first floating gate structure 286, the second floating gate structure 296, the first spacer 326a, the second spacer 326b, two portions of the portion 434 of the conductive layer 430 which are respectively adjacent to the first spacer 326a and disposed on the dielectric layers 420 over the logic well 240, two portions of the portion 436 of the conductive layer 430 which are respectively adjacent to the second spacer 326b and disposed on the erase tunnel dielectric layer 370 over the high voltage well 230. In some exemplary examples, the hard mask layer 470 may be formed from photo-resist, and the hard mask layer 470 may be formed by coating a mask material film on the first region 200a, the second region 200b, and the third region 200c, and removing portions of the etch mask material film to form the hard mask layer 470 by using a photolithography method.

Referring to FIG. 3C again, portions of the conductive layer 430, which are not covered by the hard mask layer 470, are removed, so as to form a gate 434a on the dielectric layer 420 over the logic well 240, a gate 436a on the erase tunnel dielectric layer 370 over the high voltage well 230, a first word line 434b on a sidewall of the first spacer 326a, and a second word line 436b on a sidewall of the second spacer 326b. The first spacer 326a is disposed between the first floating gate structure 286 and the first word line 434b to separate the first floating gate structure 286 from the first word line 434b. The second spacer 326b is disposed between the second floating gate structure 296 and the second word line 436b to separate the second floating gate structure 296 from the second word line 436b. In some exemplary examples, the uncovered portions of the conductive layer 430 are etched away by using the hard mask layer 470 as an etch mask. The portions of the conductive layer 430 may be removed by using a dry etch method. After the portions of the conductive layer 430 are removed, the hard mask layer 470 may be removed by a strip technique. For example, the erase gate 432, the gates 434a and 436a, the first word line 434b, and the second word line 436b may be formed from polysilicon.

Figure 3D:
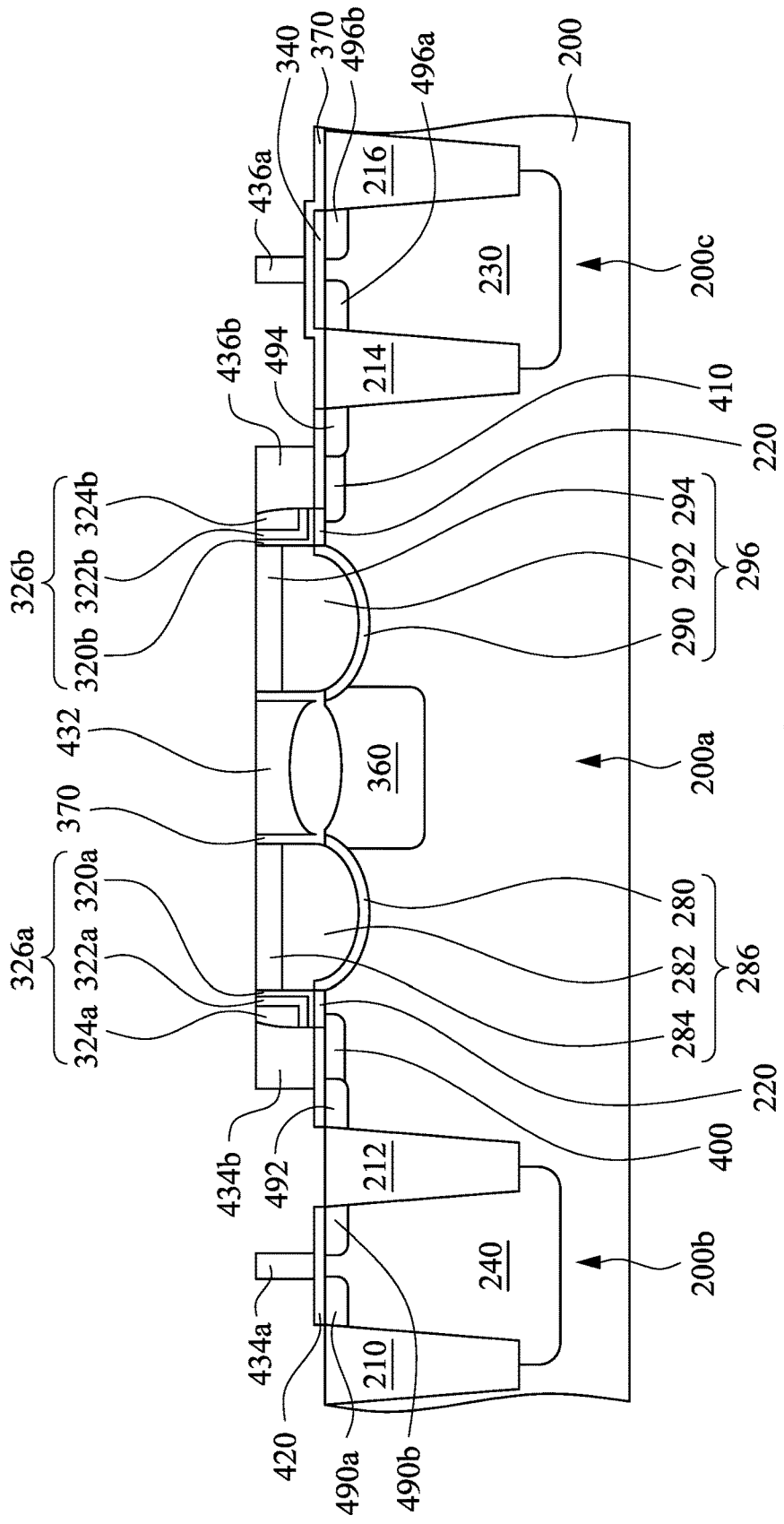

In some examples, as shown in FIG. 3D, an implantation process is performed to form lightly doped drains 490a, 490b, 492, 494, 496a, and 496b in the substrate 200. The lightly doped drains 490a and 490b are formed in the logic well 240 and respectively adjacent to opposite sides of the gate 434a. The lightly doped drains 496a and 496b are formed in the high voltage well 230 and are respectively adjacent to opposite sides of the gate 436a. The lightly doped drain 492 is formed in the implantation region 400 and is located between the first word line 434b and the isolation structure 212. The lightly doped drain 494 is formed in the implantation region 410 and is located between the second word line 436b of the conductive layer 430 and the isolation structure 214.

Figure 3E:
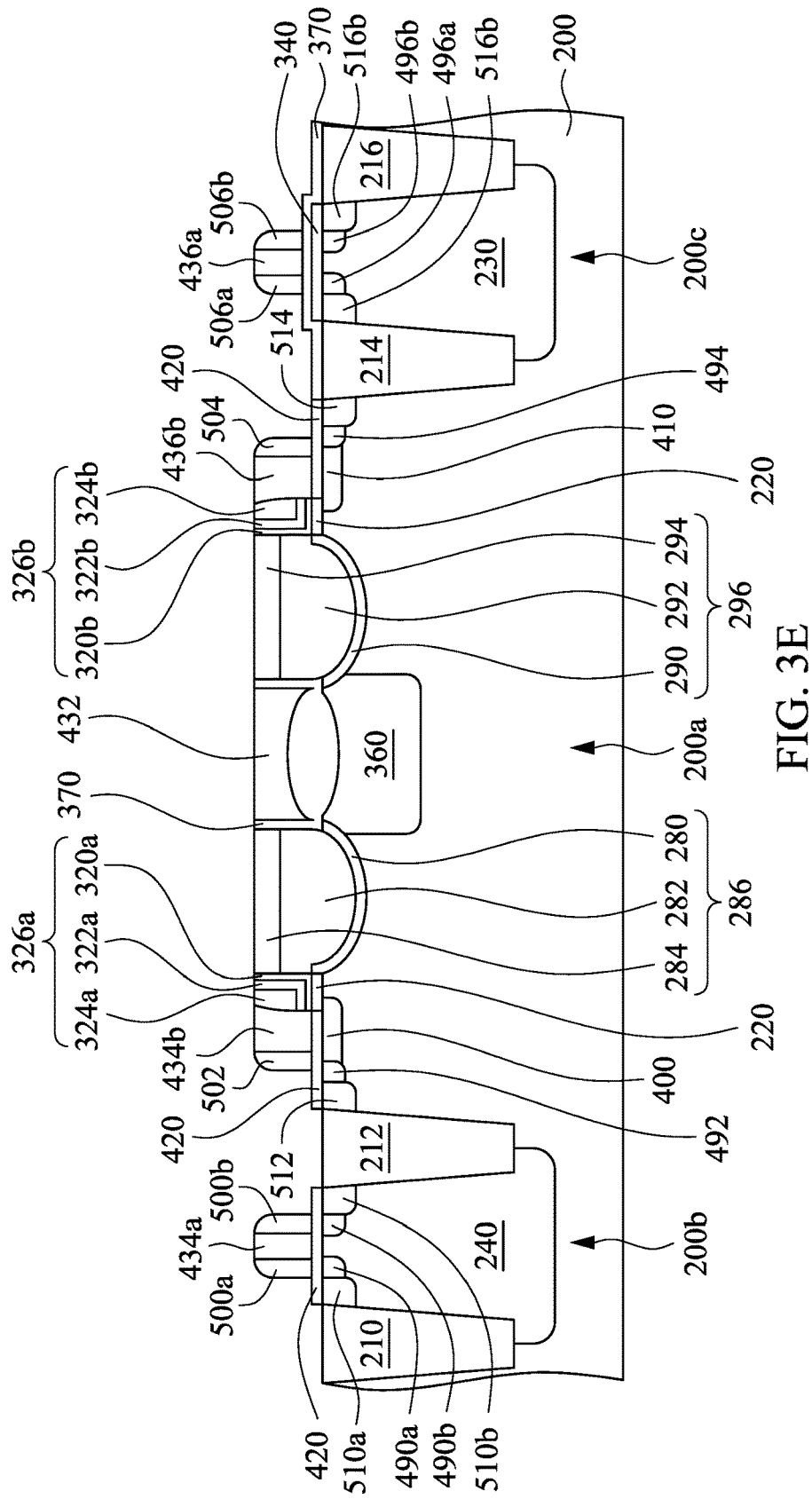

As shown in FIG. 3E, spacers 500a, 500b, 502, 504, 506a, and 506b are formed. The spacers 500a and 500b are disposed on the dielectric layer 420 over the logic well 240, and respectively abut on two opposite sidewalls of the gate 434a. The spacers 506a and 506b are disposed on the erase tunnel dielectric layer 370 over the high voltage well 230, and respectively located on two opposite sidewalls of the gate 436a. The spacer 502 is disposed on the dielectric layer 420 over the implantation region 400 and located on a sidewall of the first word line 434b. The spacer 504 is disposed on the dielectric layer 420 over the implantation region 410 and located on a sidewall of the second word line 436b. In some examples, the spacers 500a, 500b, 502, 504, 506a, and 506b are formed by blanketly depositing a spacer material film to cover the first region 200a, the second region 200b, and the third region 300c, and performing an etch back process on the spacer material film to remove a portion of the spacer material film. For example, the spacers 500a, 500b, 502, 504, 506a, and 506b may be formed from silicon nitride or silicon oxynitride.

In some examples, referring to FIG. 3E again, a source 510a, a drain 510b, an implantation regions 512 and 514, a source 516a, and a drain 516b are formed in the substrate 200 by using, for example, an implantation technique. The source 510a and the drain 510b are respectively formed in the lightly doped drains 490a and 490b, and are respectively adjacent to the opposite sides of the gate 434a. The source 516a and the drain 516b are respectively formed in the lightly doped drains 496a and 496b, and are respectively adjacent to the opposite sides of the gate 436a. The implantation region 512 is formed in the lightly doped drain 492 adjacent to the spacer 502. The implantation region 514 is formed in the lightly doped drain 494 adjacent to the spacer 504.

Figure 3F:
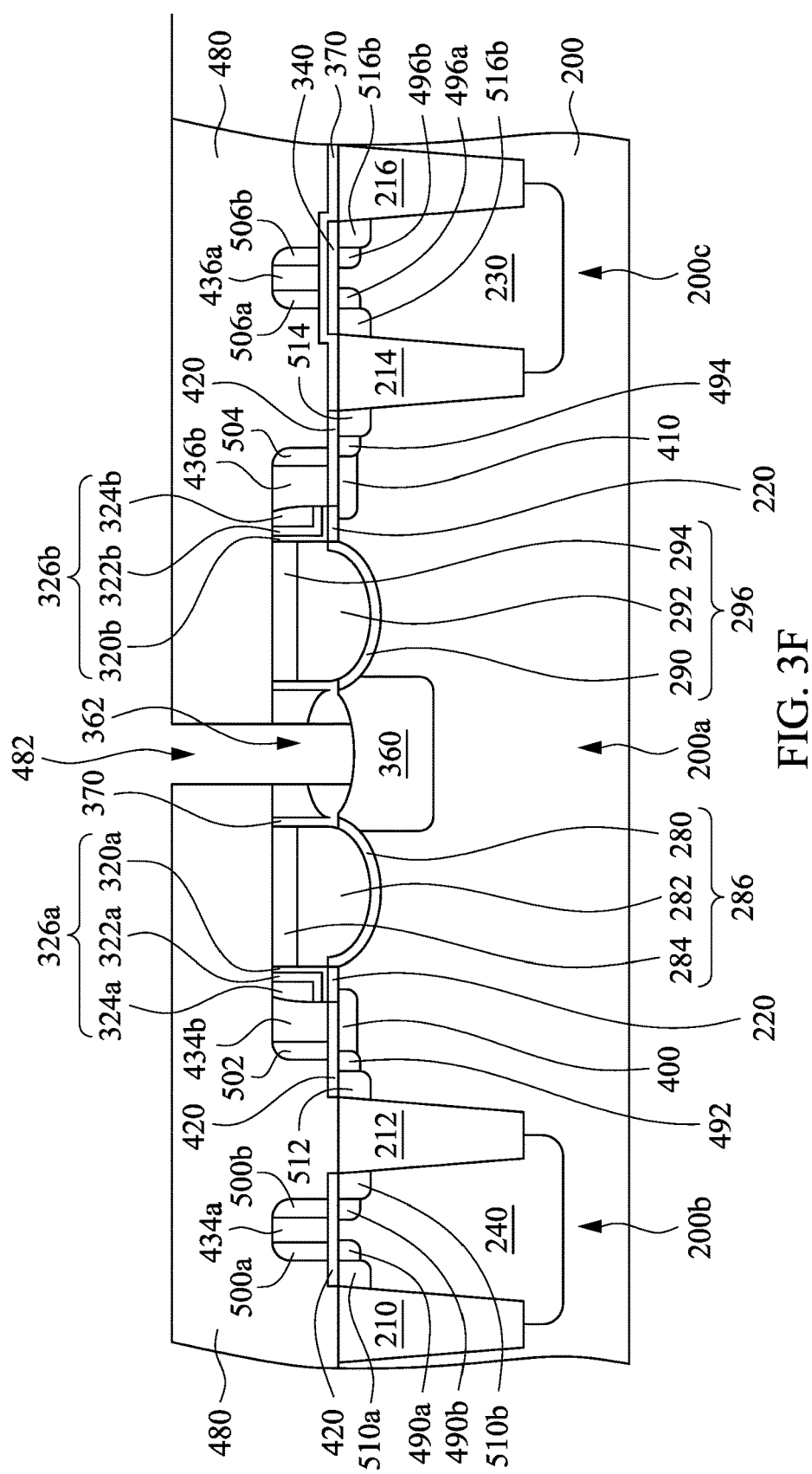

In some examples, as shown in FIG. 3F, a hard mask layer 480 is formed on the first region 200a, the second region 200b, and the third region 200c. The hard mask layer 480 is formed to have a through hole 482, in which the through hole 482 exposes a portion of the erase gate 432. In some exemplary examples, the hard mask layer 480 may be formed from photo-resist, and the hard mask layer 480 may be formed by coating a mask material film on the first region 200a, the second region 200b, and the third region 200c, and removing a portion of the mask material film to form the hard mask layer 480 having the through hole 482.

Referring to FIG. 3F again, the exposed portion of the erase gate 432 and the underlying erase tunnel dielectric layer 370 are removed to form a contact hole 362 in the erase gate 432 and the erase tunnel dielectric layer 370. The contact hole 362 exposes a portion of the common source 360. In some exemplary examples, in forming the contact hole 362, an etch process is performed to remove the exposed portion of the erase gate 432 and the underlying erase tunnel dielectric layer 370 by using the hard mask layer 480 as an etch mask. After the contact hole 362 is completed, the hard mask layer 480 may be removed by using a strip method.

Figure 3G:
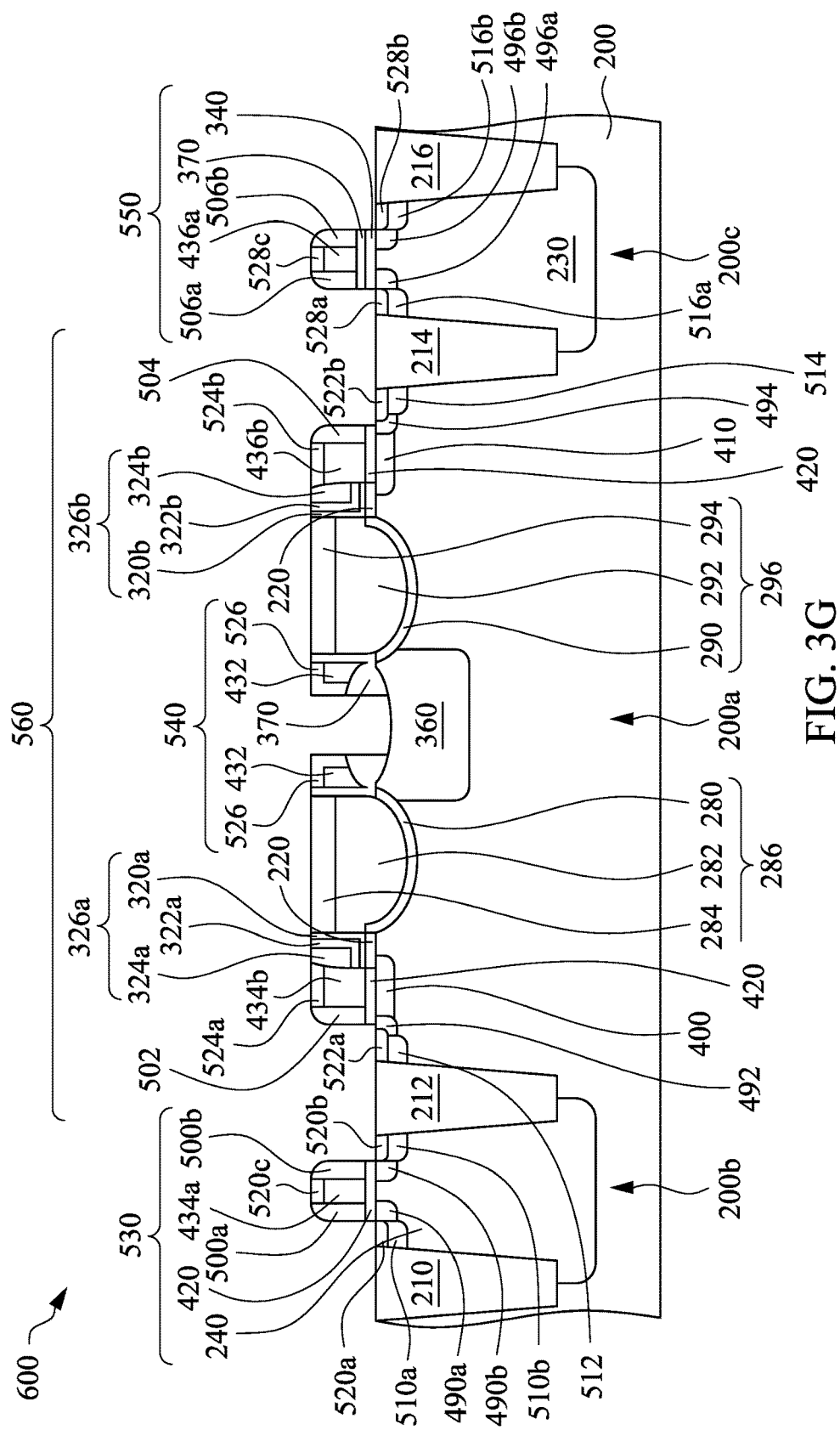

As shown in FIG. 3G, a silicide process is performed to form silicide layers 520a, 520b, 520c, 522a, 522b, 524a, 524b, 526, 528a, 528b, and 528c to substantially complete a floating gate memory cell 560, a first device 530, and a second device 550 of a semiconductor device 600. In some examples, before the silicide process, portions of the dielectric layer 420, portions of the erase tunnel dielectric layer 370 and portions of the dielectric layer 340 on the third region 200c are removed to expose the source 510a, the drain 510b, the implantation regions 512 and 514, the source 516a, and the drain 516b. The silicide layers 520a and 520b are respectively formed on the source 510a and the drain 510b in the substrate 200. The silicide layer 520c is formed on the gate 434a. The silicide layers 522a and 522b are respectively formed on the implantation regions 512 and 514 in the substrate 200. The silicide layers 524a and 524b are respectively formed on the first word line 434b and the second word line 436b. The silicide layers 526 are formed on tops and sidewalls of the erase gate 432. The silicide layers 528a and 528b are respectively formed on the source 516a and the drain 516b in the substrate 200. The silicide layer 528c is formed on the gate 436a.

Referring to FIG. 3G again, the floating gate memory cell 560 is disposed in the first region 200a. The floating gate memory cell 560 mainly includes the first floating gate structure 286, the second floating gate structure 296, an erase gate structure 540, the common source 360, the first word line 434b, the second word line 436b, the first spacer 326a, and the second spacer 326b. The erase gate structure 540 mainly includes the erase tunnel dielectric layer 370 disposed on the common source 360, the erase gate 432 disposed on the erase tunnel dielectric layer 370, and the silicide layer 526 disposed on the tops and the sidewalls of the erase gate 432. The erase gate structure 540 is disposed on the common source 360 between the first floating gate structure 286 and the second floating gate structure 296. The first word line 434b and the erase gate structure 540 are disposed at opposite sides of the first floating gate structure 286. The second word line 436b and the erase gate structure 540 are disposed at opposite sides of the second floating gate structure 296.

In some examples, the first device 530 is a low voltage device and is disposed in the second region 200b. The second device 550 is a high voltage device and is disposed in the third region 200c. In the first device 530, the logic well 240 is disposed in the substrate 200, the dielectric layer 420 is disposed on the logic well 240, the gate 434a is disposed on the dielectric layer 420, the silicide layer 520c is disposed on the gate 434a, the spacers 500a and 500b are disposed on the dielectric layer 420 and sandwiches the gate 434a and the silicide layer 520c. The dielectric layer 420 is a gate dielectric layer of the first device 530 and the gate 434a is referred as a low voltage gate. In the second device 540, the high voltage well 230 is disposed in the substrate 200, the dielectric layer 340 and the erase tunnel dielectric layer 370 are disposed on the high voltage well 230 in sequence, the gate 436a is disposed on a portion of the erase tunnel dielectric layer 370 on the high voltage well 230, the silicide layer 528c is disposed on the gate 436a, the spacers 506a and 506b are disposed on the erase tunnel dielectric layer 370 and sandwiches the gate 436a and the silicide layer 528c. The combination of the dielectric layer 340 and the erase tunnel dielectric layer 370 is a gate dielectric layer of the second device 540, and the gate 436a is referred as a high voltage gate. In some exemplary examples, the dielectric layer 420 of the first device 530 is thinner than the combination of the dielectric layer 340 and the erase tunnel dielectric layer 370 of the second device 540.

Figure 4:
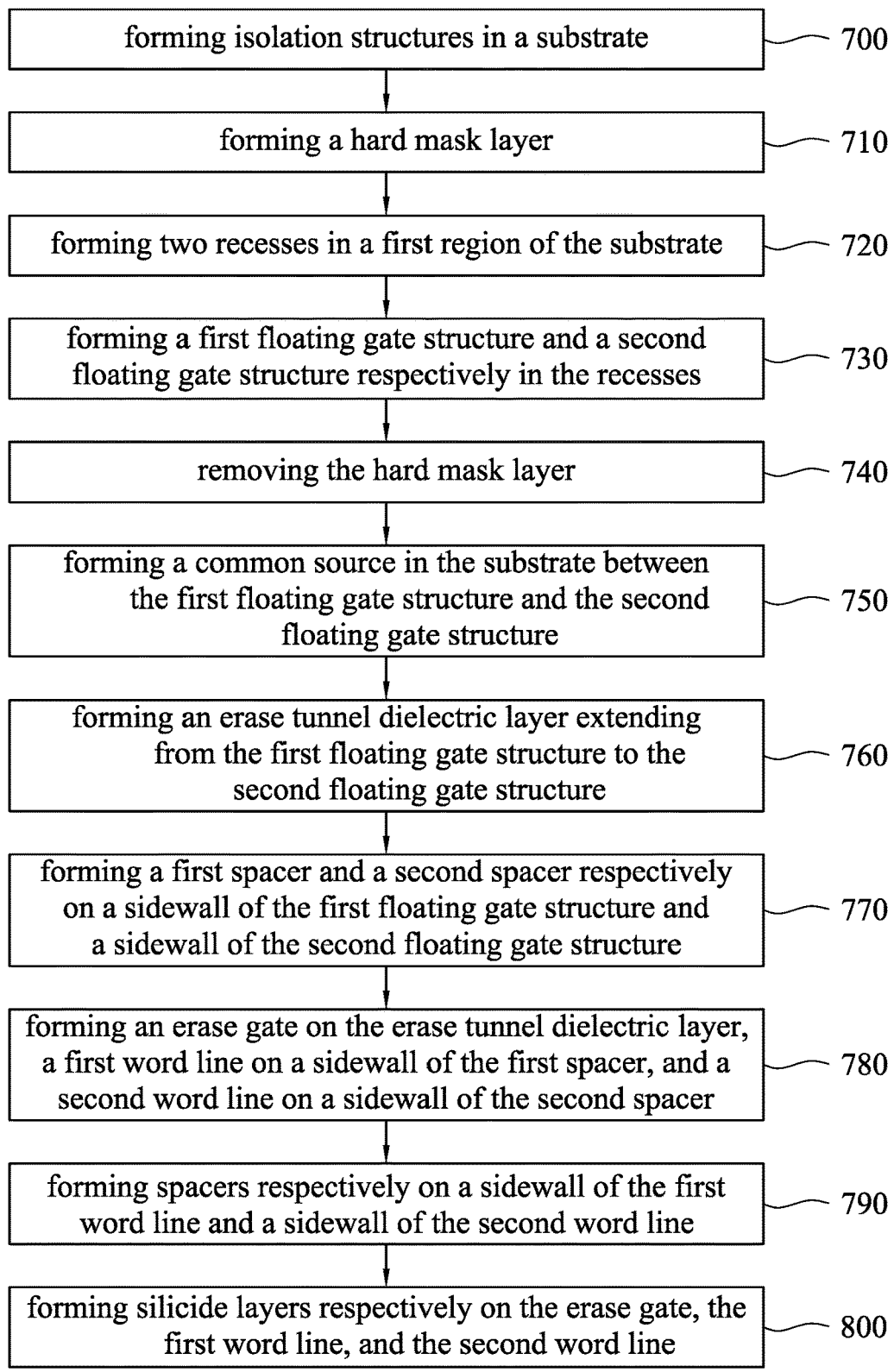
FIG. 4 is a flow chart of a method for manufacturing a semiconductor device in accordance with various embodiments.

Referring to FIG. 4 with FIG. 2A through FIG. 3G, FIG. 4 is a flow chart of a method for manufacturing a semiconductor device in accordance with various embodiments. The method begins at operation 700, where various isolation structures 210, 212, 214, and 216 are formed in a substrate 200 as shown in FIG. 2A. The isolation structures 210, 212, 214, and 216 are formed to at least define a first region 200a, a second region 200b, and a third region 200c on the substrate 200. In some examples, a high voltage well 230 and a logic well 240 are respectively formed in the third region 200c and the second region 200b.

At operation 710, as shown in FIG. 2B, a hard mask layer 250 is formed on the first region 200a, the second region 200b, and the third region 200c. The hard mask layer 250 is formed to expose two portions 220a and 220b of a pad oxide layer 220 on two portions 200a' and 200a" of the first region 200a. At operation 720, as shown in FIG. 2C and FIG. 2D, two recesses 260 and 270 are formed in the portions 200a' and 200a" of the first region 200a in the substrate 200.

At operation 730, referring to FIG. 2E through FIG. 2I, a first floating gate structure 286 and a second floating gate structure 296 are respectively formed in the recesses 260 and 270. The first floating gate structure 286 is formed to include a gate dielectric layer 280 covering a surface 260s of the recess 260, a floating gate 282 disposed on the gate dielectric layer 280 in the recess 260, and a mask layer 284 disposed on the floating gate 282. The second floating gate structure 296 is formed to include a gate dielectric layer 290 covering a surface 270s of the recess 270, a floating gate 292 disposed on the gate dielectric layer 290 in the recess 270, and a mask layer 294 disposed on the floating gate 292. At operation 740, as shown in FIG. 2J, the hard mask layer 250 are removed to expose a sidewall 286s of the first floating gate structure 286 and a sidewall 286s of the second floating gate structure 296.

At operation 750, referring to FIG. 2K through FIG. 2O, a common source 360 is formed in the substrate 200 between the first floating gate structure 286 and the second floating gate structure 296. At operation 760, referring to FIG. 2P through FIG. 2T, an erase tunnel dielectric layer 370 is formed to extend from a portion of the first floating gate structure 286 to a portion of the second floating gate structure 296 through the common source 360.

At operation 770, as shown in FIG. 2U, a first spacer 326a and a second spacer 326b are respectively formed on the sidewall 286s of the first floating gate structure 286 and the sidewall 296s of the second floating gate structure 296. The first spacer 326a and the common source 360 are respectively at opposite sides of the first floating gate structure 286. The second spacer 326b and the common source 360 are respectively at opposite sides of the second floating gate structure 296.

At operation 780, referring to FIG. 2W through FIG. 3C, an erase gate is formed on the erase tunnel dielectric layer 370 over the common source 360, a first word line 434b is formed on a sidewall of the first spacer 326a, and a second word line is formed on a sidewall of the second spacer 326b. In some examples, the operation 780 is performed to further form a gate 434a over the logic well 240 and a gate 436a over the high voltage well 230.

At operation 790, as shown in FIG. 3E, spacers 502 and 504 are respectively on a sidewall of the first word line 434b and a sidewall of the second word line 436b. In some examples, the operation 790 is performed to further form spacers 500a, 500b, 506a, and 506b, in which the spacers 500a and 500b respectively abut on two opposite sidewalls of the gate 434a, the spacers 506a and 506b respectively abut on two opposite sidewalls of the gate 436a.

At operation 800, as shown in FIG. 3G, silicide layers 524a, 524b, and 526 are respectively formed on the erase gate 526, the first word line 434b, and the second word line 436b. In some examples, the operation 800 is performed to further form silicide layers 520a, 520b, 520c, 522a, 522b, 528a, 528b, and 528c. The silicide layers 520a and 520b are formed on the logic well 240 adjacent to the opposite sides of the gate 434a respectively, and the silicide layer 520c is formed on the gate 434a. The silicide layers 522a and 522b are formed in the first region 200a of the substrate 200 adjacent to the spacers 502 and 504 respectively. The silicide layers 528a and 528b are formed on the high voltage well 230 adjacent to the opposite sides of the gate 436a respectively, and the silicide layer 528c is formed on the gate 436a.

In accordance with an embodiment, the present disclosure discloses a semiconductor device. The semiconductor device includes a substrate, various isolation structures, a floating gate memory cell, a first device, and a second device. The substrate has a surface. The isolation structures are disposed in the substrate to at least define a first region, a second region, and a third region on the substrate. The floating gate memory cell is disposed in the first region. The floating gate memory cell includes an erase gate structure, a first floating gate structure, a second floating gate structure, a first word line, a common source, a second word line, a first spacer, and a second spacer. The erase gate structure is disposed on the surface of the substrate. The first floating gate structure and the second floating gate structure are recessed in the substrate and are located at two opposite sides of the erase gate structure. The first word line is disposed on the surface of the substrate, in which the first word line is adjacent to the first floating gate structure opposite to the erase gate structure. The common source is disposed in the substrate between the first floating gate structure and the second floating gate structure. The second word line is disposed on the surface of the substrate, in which the second word line is adjacent to the second floating gate structure opposite to the erase gate structure. The first spacer is disposed between the first floating gate structure and the first word line. The second spacer is disposed between the second floating gate structure and the second word line. The first device is disposed in the second region. The second device is disposed in the third region.

In accordance with one embodiment, each of the first floating gate structure and the second floating gate structure includes a floating gate recessed in the substrate, a gate dielectric layer disposed between the substrate and the floating gate, and a mask layer disposed on the floating gate.

In accordance with one embodiment, the erase gate structure includes an erase gate disposed over the common source, a silicide layer disposed on the erase gate, and an erase tunnel dielectric layer disposed between the common source and the erase gate, between the first floating gate structure and the erase gate, and between the second floating gate structure and the erase gate.

In accordance with one embodiment, the floating gates, the erase gate, the first word line, and the second word line are formed from polysilicon.

In accordance with one embodiment, each of the first spacer and the second spacer comprises an oxide-nitride-oxide structure.

In accordance with one embodiment, each of the first device and the second device includes a well disposed in the substrate, a gate dielectric layer disposed on the well, a gate disposed on the gate dielectric layer, a silicide layer disposed on the gate, two third spacers disposed on the gate dielectric layer and sandwiching the gate and the silicide layer, two lightly-doped drains disposed in the well adjacent to opposite sides of the gate, and a source and a drain respectively disposed in the lightly-doped drains adjacent to the sides of the gate.

In accordance with one embodiment, the first device is a low voltage device, the second device is a high voltage device, and the gate dielectric layer of the first device is thinner than the gate dielectric layer of the second device.

In accordance with another embodiment, the present disclosure discloses a method for manufacturing a semiconductor device. In this method, various isolation structures are formed in a substrate to at least define a first region, a second region, and a third region on the substrate. Two recesses are formed in the first region of the substrate. A floating gate memory cell is formed in the first region. In forming the floating gate memory cell, a first floating gate structure and a second floating gate structure are respectively formed in the recesses. A common source is formed in the substrate between the first floating gate structure and the second floating gate structure. An erase gate structure is formed on the common source between the first floating gate structure and the second floating gate structure. A first word line and a second word line are formed on a surface of the substrate, in which the first word line and the second word line are respectively adjacent to the first floating gate structure and the second floating gate structure, and are opposite to the erase gate structure. A first spacer and a second spacer are respectively formed between the first floating gate structure and the first word line and between the second floating gate structure and the second word line. A first device is formed in the second region. A second device is formed in the third region.

In accordance with one embodiment, forming the first floating gate structure and the second floating gate structure includes forming two gate dielectric layers to respectively cover surfaces of the recesses, forming two floating gates respectively on the gate dielectric layers in the recesses, and forming two mask layers respectively on the floating gates.

In accordance with one embodiment, forming the common source includes performing an implantation process to form an implantation region in the substrate between the first floating gate structure and the second floating gate structure, and performing a furnace process to oxidize the implantation region.

In accordance with one embodiment, in forming the erase gate structure, an erase tunnel dielectric layer is formed to extend from a portion of the first floating gate structure to a portion of the second floating gate structure through the common source. An erase gate is formed on the erase tunnel dielectric layer over the common source. The erase gate is separated from the first floating gate structure and the second floating gate structure by the erase tunnel dielectric layer. A silicide layer is disposed on the erase gate.

In accordance with one embodiment, the floating gates, the erase gate, the first word line, and the second word line are formed from polysilicon.

In accordance with one embodiment, forming the first spacer and the second spacer includes forming each of the first spacer and the second spacer comprising an oxide-nitride-oxide structure.

In accordance with one embodiment, each of forming the first device and forming the second device includes forming a well in the substrate, forming a gate dielectric layer on the well, forming a gate on the gate dielectric layer, forming a silicide layer on the gate, forming two spacers on the gate dielectric layer, and sandwiching the gate and the silicide layer, forming two lightly-doped drains in the well adjacent to opposite sides of the gate, and forming a source and a drain respectively in the lightly-doped drains adjacent to the sides of the gate.

In accordance with one embodiment, the first device is a low voltage device, the second device is a high voltage device, and the gate dielectric layer of the first device is thinner than the gate dielectric layer of the second device.

In accordance with yet another embodiment, the present disclosure discloses a method for manufacturing a semiconductor device. In this method, various isolation structures are formed in a substrate to at least define a first region, a second region, and a third region on the substrate. A hard mask layer is formed on the first region, the second region, and the third region, in which the hard mask layer is formed to expose two portions of the first region. Two recesses are formed in the portions of the first region. A first floating gate structure and a second floating gate structure are respectively formed in the recesses. The hard mask layer is removed. A common source is formed in the substrate between the first floating gate structure and the second floating gate structure. An erase tunnel dielectric layer is formed to extend from a portion of the first floating gate structure to a portion of the second floating gate structure through the common source. A first spacer and a second spacer are respectively formed on a sidewall of the first floating gate structure and a sidewall of the second floating gate structure, in which the first spacer and the second spacer are opposite to the common source. An erase gate is formed on the erase tunnel dielectric layer over the common source, a first word line is formed on a sidewall of the first spacer, and a second word line is formed on a sidewall of the second spacer. A third spacer and a fourth spacer are respectively formed on a sidewall of the first word line and a sidewall of the second word line. Silicide layers are respectively formed on the erase gate, the first word line, and the second word line.

In accordance with one embodiment, before forming the erase tunnel dielectric layer, the method further includes forming a high voltage gate dielectric layer on the third region, and the erase tunnel dielectric layer is formed to cover the high voltage gate dielectric layer. Between forming the erase tunnel dielectric layer and forming the erase gate, the first word line, and the second word line, the method further includes forming a low voltage gate dielectric layer on the second region. Forming the erase gate, the first word line, and the second word line further includes forming a low voltage gate on a portion of the low voltage gate dielectric layer, and a high voltage gate on a portion of the high voltage gate dielectric layer.

In accordance with one embodiment, forming the first floating gate structure and the second floating gate structure includes forming two gate dielectric layers to respectively cover surfaces of the recesses, forming two floating gates respectively on the gate dielectric layers in the recesses, and forming two mask layers respectively on the floating gates.

In accordance with one embodiment, the floating gates, the erase gate, the first word line, the second word line, the low voltage gate, and the high voltage gate are formed from polysilicon.

In accordance with one embodiment, before forming the erase gate, the first word line, and the second word line, the method further includes forming two implantation regions in the substrate in the first region, in which the implantation regions are respectively adjacent to the first spacer and the second spacer opposite to the common source.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate having a surface;
   a plurality of isolation structures disposed in the substrate to at least define a first region, a second region, and a third region on the substrate;
   a floating gate memory cell disposed in the first region, wherein the floating gate memory cell comprises:
      an erase gate structure disposed on the surface of the substrate;
      a first floating gate structure and a second floating gate structure recessed in the substrate and located at two opposite sides of the erase gate structure;
      a first word line disposed on the surface of the substrate, wherein the first word line is adjacent to the first floating gate structure opposite to the erase gate structure;
      a common source disposed in the substrate between the first floating gate structure and the second floating gate structure;
      a second word line disposed on the surface of the substrate, wherein the second word line is adjacent to the second floating gate structure opposite to the erase gate structure;
      a first spacer disposed between the first floating gate structure and the first word line; and
      a second spacer disposed between the second floating gate structure and the second word line;
   a first device disposed in the second region; and
   a second device disposed in the third region.

2. The semiconductor device of claim 1, wherein each of the first floating gate structure and the second floating gate structure comprises:
   a floating gate recessed in the substrate;
   a gate dielectric layer disposed between the substrate and the floating gate; and
   a mask layer disposed on the floating gate.

3. The semiconductor device of claim 2, wherein the erase gate structure comprises:
   an erase gate disposed over the common source;
   a silicide layer disposed on the erase gate; and
   an erase tunnel dielectric layer disposed between the common source and the erase gate, between the first floating gate structure and the erase gate, and between the second floating gate structure and the erase gate.

4. The semiconductor device of claim 3, wherein the floating gates, the erase gate, the first word line, and the second word line are formed from polysilicon.

5. The semiconductor device of claim 1, wherein each of the first spacer and the second spacer comprises an oxide-nitride-oxide (ONO) structure.

6. The semiconductor device of claim 1, wherein each of the first device and the second device comprises:
   a well disposed in the substrate;
   a gate dielectric layer disposed on the well;
   a gate disposed on the gate dielectric layer;
   a silicide layer disposed on the gate;
   two third spacers disposed on the gate dielectric layer, and sandwiching the gate and the silicide layer;
   two lightly-doped drains disposed in the well adjacent to opposite sides of the gate; and
   a source and a drain respectively disposed in the lightly-doped drains adjacent to the sides of the gate.

7. The semiconductor device of claim 6, wherein the first device is a low voltage device, the second device is a high voltage device, and the gate dielectric layer of the first device is thinner than the gate dielectric layer of the second device.

8. A method for manufacturing a semiconductor device, the method comprising:
   forming a plurality of isolation structures in a substrate to at least define a first region, a second region, and a third region on the substrate;
   forming two recesses in the first region of the substrate;
   forming a floating gate memory cell in the first region, wherein forming the floating gate memory cell comprises:
      forming a first floating gate structure and a second floating gate structure respectively in the recesses;
      forming a common source in the substrate between the first floating gate structure and the second floating gate structure;
      forming an erase gate structure on the common source between the first floating gate structure and the second floating gate structure;
      forming a first word line and a second word line on a surface of the substrate, wherein the first word line and the second word line are respectively adjacent to the first floating gate structure and the second floating gate structure, and are opposite to the erase gate structure; and
      forming a first spacer and a second spacer respectively between the first floating gate structure and the first word line and between the second floating gate structure and the second word line;
   forming a first device in the second region; and
   forming a second device in the third region.

9. The method of claim 8, wherein forming the first floating gate structure and the second floating gate structure comprises:
   forming two gate dielectric layers to respectively cover surfaces of the recesses;
   forming two floating gates respectively on the gate dielectric layers in the recesses; and
   forming two mask layers respectively on the floating gates.

10. The method of claim 9, wherein forming the common source comprises:
   performing an implantation process to form an implantation region in the substrate between the first floating gate structure and the second floating gate structure; and
   performing a furnace process to oxidize the implantation region.

11. The method of claim 9, wherein forming the erase gate structure comprises:
   forming an erase tunnel dielectric layer to extend from a portion of the first floating gate structure to a portion of the second floating gate structure through the common source;
   forming an erase gate on the erase tunnel dielectric layer over the common source, wherein the erase gate is separated from the first floating gate structure and the second floating gate structure by the erase tunnel dielectric layer; and
   forming a silicide layer disposed on the erase gate.

12. The method of claim 11, wherein the floating gates, the erase gate, the first word line, and the second word line are formed from polysilicon.

13. The method of claim 8, wherein forming the first spacer and the second spacer comprises forming each of the first spacer and the second spacer comprising an oxide-nitride-oxide structure.

14. The method of claim 8, wherein each of forming the first device and forming the second device comprises:
   forming a well in the substrate;
   forming a gate dielectric layer on the well;
   forming a gate on the gate dielectric layer;
   forming a silicide layer on the gate;
   forming two spacers on the gate dielectric layer, and sandwiching the gate and the silicide layer;
   forming two lightly-doped drains in the well adjacent to opposite sides of the gate; and
   forming a source and a drain respectively in the lightly-doped drains adjacent to the sides of the gate.

15. The method of claim 14, wherein the first device is a low voltage device, the second device is a high voltage device, and the gate dielectric layer of the first device is thinner than the gate dielectric layer of the second device.

16. A method for manufacturing a semiconductor device, the method comprising:
   forming a plurality of isolation structures in a substrate to at least define a first region, a second region, and a third region on the substrate;
   forming a hard mask layer on the first region, the second region, and the third region, wherein the hard mask layer is formed to expose two portions of the first region;
   forming two recesses in the portions of the first region;
   forming a first floating gate structure and a second floating gate structure respectively in the recesses;
   removing the hard mask layer;
   forming a common source in the substrate between the first floating gate structure and the second floating gate structure;
   forming an erase tunnel dielectric layer to extend from a portion of the first floating gate structure to a portion of the second floating gate structure through the common source;
   forming a first spacer and a second spacer respectively on a sidewall of the first floating gate structure and a sidewall of the second floating gate structure, wherein the first spacer and the second spacer are opposite to the common source;
   forming an erase gate on the erase tunnel dielectric layer over the common source, a first word line on a sidewall of the first spacer, and a second word line on a sidewall of the second spacer;
   forming a third spacer and a fourth spacer respectively on a sidewall of the first word line and a sidewall of the second word line; and forming silicide layers respectively on the erase gate, the first word line, and the second word line.

17. The method of claim 16, wherein before forming the erase tunnel dielectric layer, the method further comprises forming a high voltage gate dielectric layer on the third region, and the erase tunnel dielectric layer is formed to cover the high voltage gate dielectric layer;

between forming the erase tunnel dielectric layer and forming the erase gate, the first word line, and the second word line, the method further comprises forming a low voltage gate dielectric layer on the second region; and forming the erase gate, the first word line, and the second word line further comprises forming a low voltage gate on a portion of the low voltage gate dielectric layer, and a high voltage gate on a portion of the high voltage gate dielectric layer.

18. The method of claim 17, wherein forming the first floating gate structure and the second floating gate structure comprises:

forming two gate dielectric layers to respectively cover surfaces of the recesses;

forming two floating gates respectively on the gate dielectric layers in the recesses; and forming two mask layers respectively on the floating gates.

19. The method of claim 18, wherein the floating gates, the erase gate, the first word line, the second word line, the low voltage gate, and the high voltage gate are formed from polysilicon.

20. The method of claim 16, wherein before forming the erase gate, the first word line, and the second word line, the method further comprises:

forming two implantation regions in the substrate in the first region, wherein the implantation regions are respectively adjacent to the first spacer and the second spacer opposite to the common source.

* * * * *